(12) United States Patent
Khan et al.

(10) Patent No.: US 11,011,249 B2
(45) Date of Patent: May 18, 2021

(54) CONCURRENT TESTING OF A LOGIC DEVICE AND A MEMORY DEVICE WITHIN A SYSTEM PACKAGE

(71) Applicant: NVIDIA Corporation, Santa Clara, CA (US)

(72) Inventors: Amanulla Khan, Bangalore (IN); Kelly Yang, Sunnyvale, CA (US); Lianrui Zhang, Santa Clara, CA (US); Himakiran Kodihalli, Cupertino, CA (US); Thenappan Nachiappan, Dublin, CA (US); Sreekar Sreesailam, Bangalore (IN)

(73) Assignee: NVIDIA Corporation, Santa Clara, CA (US)

( * ) Notice: Subject to any disclaimer, the term of this patent is extended or adjusted under 35 U.S.C. 154(b) by 159 days.

(21) Appl. No.: 16/547,402

(22) Filed: Aug. 21, 2019

(65) Prior Publication Data

US 2021/0057036 A1 Feb. 25, 2021

(51) Int. Cl.
*G01R 31/3177* (2006.01)
*G11C 29/38* (2006.01)
*H01L 25/065* (2006.01)
*H01L 25/18* (2006.01)

(52) U.S. Cl.
CPC .......... *G11C 29/38* (2013.01); *G01R 31/3177* (2013.01); *H01L 25/0657* (2013.01); *H01L 25/18* (2013.01); *H01L 2225/06517* (2013.01); *H01L 2225/06541* (2013.01); *H01L 2225/06596* (2013.01)

(58) Field of Classification Search
CPC . G11C 29/38; G01R 31/3177; H01L 25/0657; H01P 25/18
See application file for complete search history.

(56) References Cited

U.S. PATENT DOCUMENTS

| | | | |
|---|---|---|---|
| 7,856,577 B2* | 12/2010 | Andreev | G11C 29/16 714/42 |
| 8,922,243 B2* | 12/2014 | Jayasena | G06F 13/4234 326/39 |
| 10,930,364 B2* | 2/2021 | Motika | G11C 29/56 |
| 2010/0174955 A1* | 7/2010 | Carnevale | G11C 5/04 714/718 |
| 2020/0279793 A1* | 9/2020 | Xie | H01L 25/0652 |

* cited by examiner

*Primary Examiner* — Phung M Chung
(74) *Attorney, Agent, or Firm* — Leydig, Voit & Mayer, Ltd.

(57) ABSTRACT

Testing packaged integrated circuit (IC) devices is difficult and time consuming. When multiple devices (dies) are packaged to produce a SiP (system in package) the devices should be tested for defects that may be introduced during the packaging process. With limited access to the inputs and outputs of the devices, test times increase compared with testing the devices before they are packaged. A CoWoS (chip on wafer on substrate) SiP includes a logic device and a memory device and has interfaces between the logic device and memory device that cannot be directly accessed at a package ball. Test programs are concurrently executed by the logic device and the memory device to reduce testing time. Each memory device includes a BIST (built-in self-test) module that is initialized and executes the memory test program while the one or more modules within the logic device are tested.

20 Claims, 14 Drawing Sheets

ThinkCONCURRENT TESTING OF A LOGIC DEVICE AND A MEMORY DEVICE WITHIN A SYSTEM PACKAGE

TECHNICAL FIELD

The present disclosure relates to testing integrated circuit devices, and more particularly to concurrent testing of a logic device and a memory device within a system package.

BACKGROUND

Testing packaged integrated circuit (IC) devices is difficult and time consuming. When multiple devices (dies) are packaged to produce a SiP (system in package) the devices should be tested for defects that may be introduced during the packaging process. With limited access to the inputs and outputs of the devices, test times increase compared with testing the devices before they are packaged. A CoWoS (chip on wafer on substrate) SiP includes a logic device and a memory device and has interfaces between the logic device and memory device that are routed within an interposer and/or Through Silicon Vias (TSVs). One technical challenge is that the interfaces cannot be directly accessed at a package ball making testing of the devices more difficult. Thus, there is a need for addressing these issues and/or other issues associated with the prior art.

SUMMARY

Testing packaged integrated circuit (IC) devices is difficult and time consuming. When multiple devices (dies) are packaged to produce a SiP (system in package) the devices should be tested for defects that may be introduced during the packaging process. With limited access to the inputs and outputs of the devices, test times increase compared with testing the devices before they are packaged. A CoWoS SiP includes a logic device and a memory device and has interfaces between the logic device and memory device that are routed within an interposer and/or TSVs, and the interfaces cannot be directly accessed at a package ball. A flexible test control framework enables concurrent execution of test programs by the logic device and the memory device to reduce testing time. Each memory device includes a BIST (built-in self-test) module that is initialized and executes the memory test program while the one or more modules within the logic device are tested.

A method and system are disclosed for concurrent testing of a logic device and a memory device within a system package by initializing the memory device for testing, where the system package includes the memory device and the logic device. A first portion of signals between the memory device and the logic device are routed within an interposer or TSVs enclosed by the system package and a second portion of signals for the logic device are coupled to package balls of the system package. A first test program is executed to test the memory device and, concurrent with execution of the first test program, a second test program is executed to test a first module within the logic device.

DETAILED DESCRIPTION

Recently, large capacity High Bandwidth Memories (HBM)s are being included with a processor in a system package, such as a Chip-on-Wafer-on-Substrate (CoWoS) package. The complex systems that include multiple die within a system package are needed for deep learning and artificial intelligence to become a reality for complex real-life applications like self-driving cars, voice and language recognition and translation, and image and picture analysis. Including a processor die and one or more memory dies in a single package allows a system to operate at faster speeds, provides increased memory bandwidth, improves performance, and reduces power consumption. However, testing a complex system requires very long test times due to the huge chip transistor count and fault coverage requirement. Longer test times increase the chip production cycle time and manufacturing test cost.

Figure 1A:
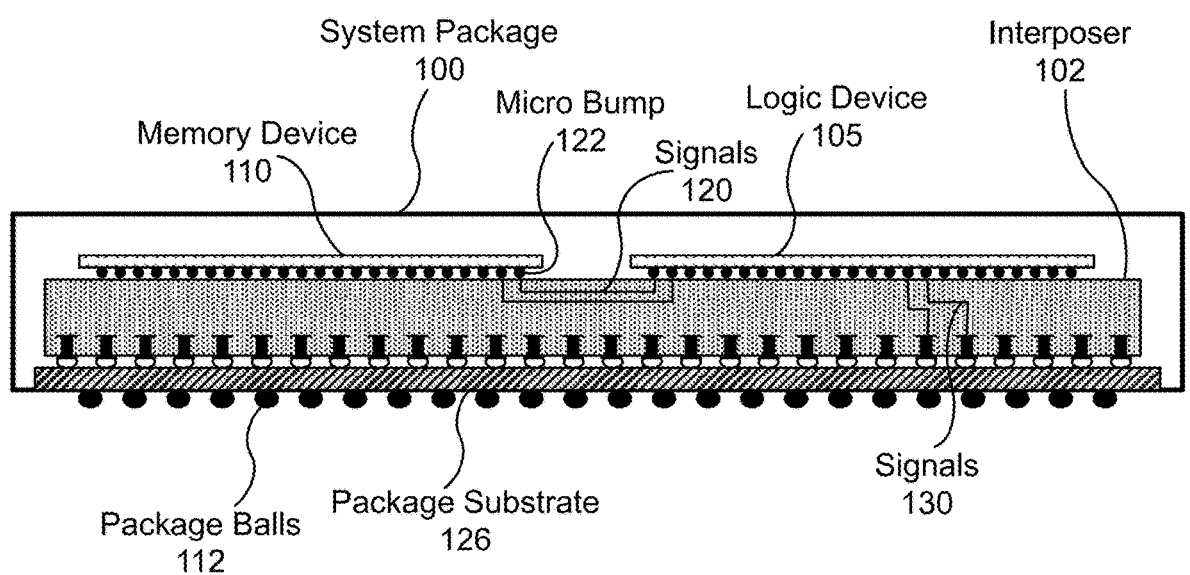
FIG. 1A illustrates a system package including a logic device and a memory device, in accordance with an embodiment.

FIG. 1A illustrates a system package 100 including a logic device 105 and a memory device 110, in accordance with an embodiment. In an embodiment, the logic device 105 is a processor such as a graphics processing unit (GPU), central processing unit (CPU), field programmable gate-array (FPGA), microcontroller unit (MCU), application-specific integrated circuit (ASIC), System on Chip (Soc), Network on Chip (NoC), etc. The logic device 105 and memory device 110 may be separate dies that, in an embodiment, may each be individually packaged as a discrete chip suitable for attachment to a printed circuit board (PCB). Compared with a system using individually packaged devices, the memory bus/interface is wider, the length of electrical connections (e.g., traces) is shorter and signal integrity improved compared with longer connections (e.g., traces or wires) used to connect individually packaged devices.

As shown in FIG. 1A, the logic device 105 and memory device 110 are separate die that are each attached to an interposer 102 by the micro bumps 122. Each micro bump 122 is positioned under an input/output pad fabricated as part of the die. In an embodiment, the interposer 102 is a silicon substrate within which electrical connections are fabricated to electrically couple one or more inputs and/or outputs of the logic device 105 to package balls 112 through the package substrate 126. Note that, in contrast with the package balls 112, the micro bumps 122 are not able to be physically contacted by test equipment probes. Therefore, test signals generated by test equipment to initiate and control testing of the logic device 105 and/or memory device 110 may be applied at the package balls 112.

Signals 120 between the logic device 105 and the memory device 110 may be transmitted by electrical connections (e.g., metal wires) fabricated within the interposer 102. The interposer 102 is mounted on top of a package substrate 126. The package substrate 126 provides mechanical support and electrical connections between the signals 130 within the interposer 102 and the package balls 112. Signals 130 for inputs and/or output of the logic device 105 are also inputs and/or outputs of the system package 100 and the signals 130 may be accessed at the package balls 112. In contrast, the signals 120 cannot be accessed at the package balls 112.

In an embodiment, at least one input and/or output of the memory device 110 is transmitted by an electrical connection fabricated within the interposer 102 and can be accessed at the package balls 112. However, the number of package balls 112 is limited and, as the number of inputs and/or outputs of the logic device 105 increases, most of the package balls 112 may be needed to access the inputs and/or outputs of the logic device 105. Therefore, it is not usually possible to provide access to the inputs and/or outputs of the memory device 110 at the package balls for testing.

In an embodiment, the memory device 110 is a dynamic random-access memory (DRAM). In an embodiment, the memory device 110 is replaced with a stack of a DRAM devices. In the context of the following description, the memory device 110 may be one or more memory devices coupled to the logic device 105 through a HBMx interface, where x is alphabetically and/or numerically sequenced.

The processing performance and transistor count of the logic device 105 is high. Consequently, the tests that satisfy the fault tolerance requirements for the specific applications to be executed on the logic device 105 are complex. Because the logic device 105 and the memory device 110 are fabricated by different chip makers, the testing methods for the logic device 105 and the memory device 110 packaged within the system package 100 are a combination of the different chip maker testing strategies. Conventionally, before being packaged in the system package 100, the logic device 105 and the memory device 110 are tested separately with independent test patterns (e.g., vectors). During the packaging production and/or characterization test flow sequence, after the logic device 105 and the memory device 110 are installed inside the system package 100, the logic device 105 and the memory device 110 are tested sequentially and independently. The multiple test strategies for testing the logic device 105 and the memory device 110 installed inside the system package 100 are derived from each chip maker's design methodology, electronic design automation (EDA) tools, and software selections.

A flexible test control (FTC) framework may be used to test the logic device 105 and the memory device 110 installed inside the system package 100 concurrently, enabling all of the system functional blocks that do not share inputs and/or outputs to be tested in parallel. The FTC framework specifies circuitry for concurrent testing of the logic device 105 and/or the memory device 110. Within the FTC framework, the sequence of the tests (test flow) is flexible and the format of the test is also flexible. Not only is the chip test time reduced, the FTC framework increases production throughput and chip shipment rate. Using the FTC framework also requires no modifications to the automated test equipment (ATE) hardware. The FTC framework may increase chip test fault coverage by testing more realistic operational use modes with many chip functions operating concurrently during testing.

More illustrative information will now be set forth regarding various optional architectures and features with which the foregoing framework may be implemented, per the desires of the user. It should be strongly noted that the following information is set forth for illustrative purposes and should not be construed as limiting in any manner. Any of the following features may be optionally incorporated with or without the exclusion of other features described.

Figure 1B:
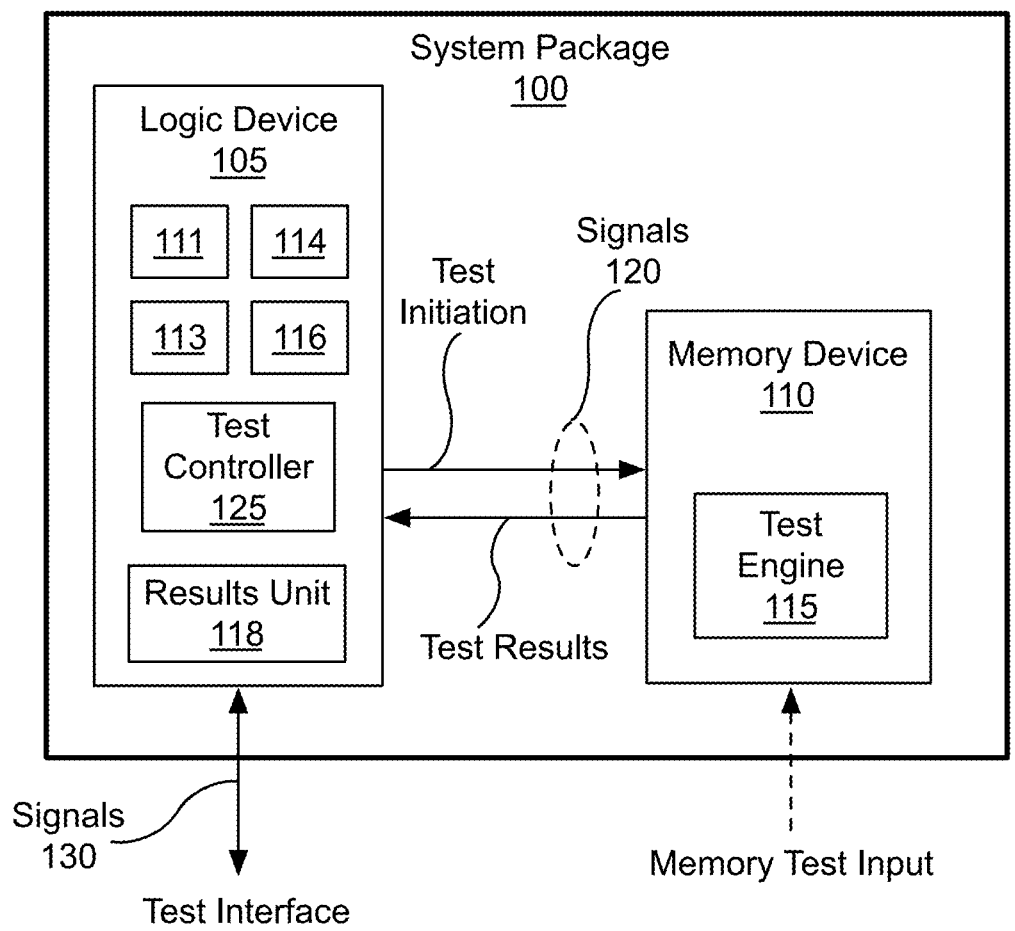
FIG. 1B illustrates a block diagram of the logic device and the memory device within the system package shown in FIG. 1A, in accordance with an embodiment.

FIG. 1B illustrates a block diagram of the logic device 105 and the memory device 110 within the system package 100 shown in FIG. 1A, in accordance with an embodiment. The logic device 105 includes a test controller 125, results unit 118, and modules 111, 113, 114, and 116. Each of the modules 111, 113, 114, and 116 includes digital circuitry to be tested. The test controller 125 may be configured to initiate testing of the modules 111, 113, 114, and 116 and the memory device 110. The results unit 118 receives and evaluates test results for tests executed on the modules 111, 113, 114, and 116 and the memory device 110. A test interface includes the signals 130 for communication with the logic device 105. In an embodiment, the test interface is accessed through one or more package balls 112.

In an embodiment, the test engine 115 is a BIST (built-in self-test) module that is initialized by the test controller 125 and executes a memory test program for the memory device 110. Persons of ordinary skill in the art will understand that any system that performs the operations of the test controller 125 and/or test engine 115 is within the scope and spirit of embodiments of the present disclosure.

A memory test may be executed concurrently with execution of one or more logic tests within the logic device 105 to test the modules 111, 113, 114, and 116. The test controller 125 initiates execution of the one or more logic tests to test the modules 111, 113, 114, and 116. The memory test may be executed in parallel (e.g. concurrently) with one or more of the logic tests because the ports (inputs and/or outputs) of the logic device 105 accessed for execution of the tests are not also accessed for execution of the memory test. Similarly, one or more of the logic tests for the modules 111, 113, 114, and 116 may be executed concurrently when the logic tests do not require access to the same ports (input and/or outputs) of the logic device 105 and the respective modules 111, 113, 114, and 116. More generally, one or more of the logic tests and the memory test may be executed concurrently when the one or more logic tests and the memory test do not share any resources, where a resource is an input signal, output signal, clock, register, or other circuitry that requires independent control for the one or more logic tests and the memory test.

In an embodiment, the memory device 110 includes a direct access memory test input that is used to initiate execution of the memory test by the test engine 115. When the memory test input is available, the test controller 125 does not initiate execution of the memory test. The memory test input is coupled to a set of the package balls 112 of the system package 100. In an embodiment, the memory test input is only used to initialize the memory device 110 for execution of the memory test and is not accessed during execution of the memory test.

In another embodiment, the test interface that transmits the signals 130 is accessed to cause the test controller 125 within the logic device 105 to initiate execution of the memory test by the test engine 115. Specifically, the test controller 125 initiates execution of the memory test by communicating over the signals 120 between the logic device 105 and the memory device 110. In an embodiment, the signals 120 implement an Institute of Electronics and Electrical Engineers (IEEE) 1500 interface. In an embodiment, the wires or connections used to transmit the signals 120 during testing are repurposed for use during normal operation.

When execution of the memory test is complete, test results indicating the presence or absence of faults in the memory device 110 are sent from the test engine 115 to the logic device 105 through the signals 120. The test results may be evaluated and stored in the results unit 118. The test results may be stored during execution of a memory test or when execution of a memory test is complete. In an embodiment, the test results that are stored, and any status produced by evaluation of the test results, may be accessed through the test interface. The test results may be used to perform binning of the system package 100 or to repair the logic device 105 or memory device 110. The system package 100 may be binned, based on the test results, for operation at different frequencies, performance, power characteristics, functions, and the like.

Using the FTC framework, different modules (e.g., functional blocks) within the logic device 105, such as the modules 111, 113, 114, and 116, and the memory device 110 may be tested in a completely flexible and concurrent fashion. Concurrent testing may reduce the test time by half and increase the system test fault coverage without adding or requiring any changes to automated tester equipment hardware or software. Therefore, the test time is reduced and realistic operational power and speed of the logic device 105 is experienced during testing. Increased system test fault coverage may include coverage due to power noise, resulting from realistic operating conditions of the concurrent testing. In contrast, testing of multiple packaged devices on a printed circuit board (PCB) is conventionally performed using a boundary scan technique where each bit of the test vectors are shifted into an input of a scan chain and serially sequenced through each of the packaged devices. Because each of the packaged devices may be thoroughly tested after being packaged, the printed circuit board level testing is performed to identify failures resulting from installing (e.g., mounting) the packaged devices onto the PCB. Thoroughly testing the individual packaged devices, as is done during functional testing, using the boundary scan technique after the packaged devices are installed on the PCB would be prohibitively slow.

Figure 1C:
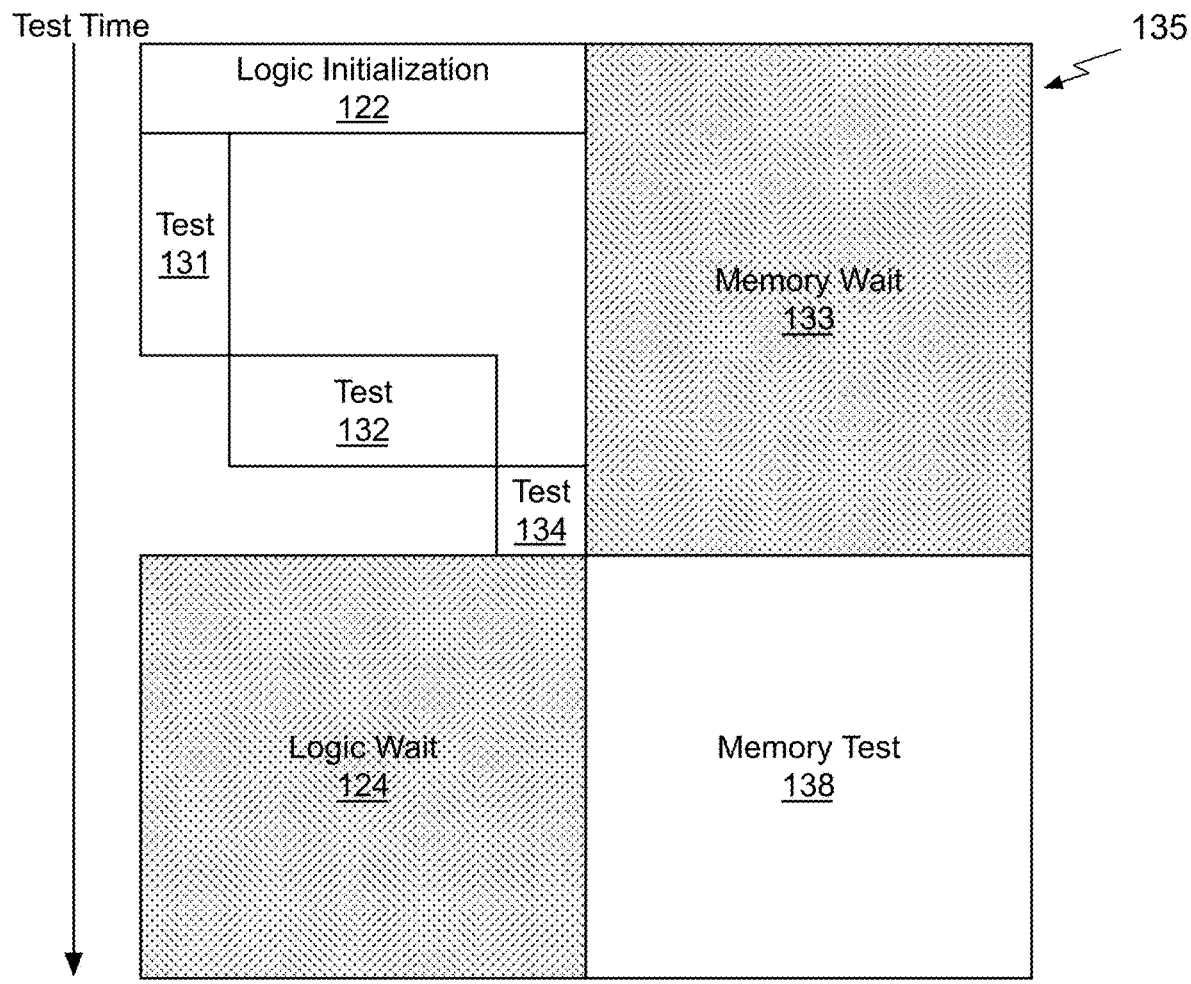
FIG. 1C illustrates sequential and concurrent testing of the logic device and the memory device within the system package shown in FIG. 1A, in accordance with an embodiment.
Figure 1C:
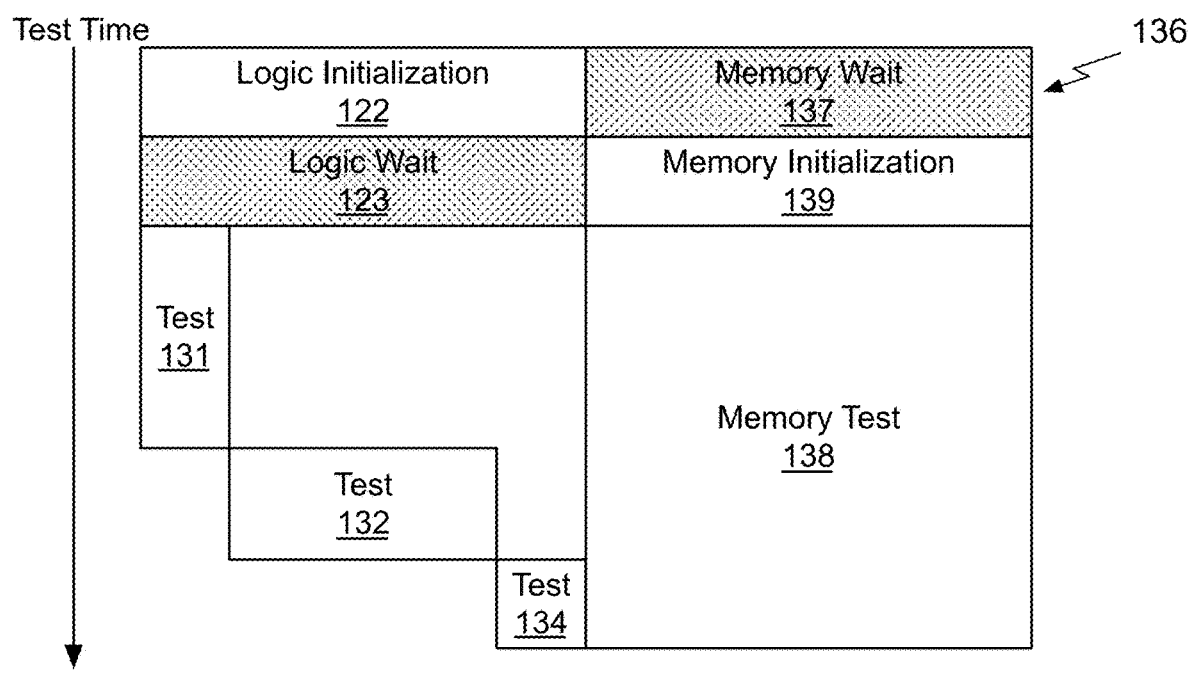

FIG. 1C illustrates sequential and concurrent testing of the logic device 105 and the memory device 110 within the system package 100 shown in FIG. 1A, in accordance with an embodiment. A test flow sequence 135 implements sequential testing of the logic device 105 and the memory device 110. Because different manufacturers fabricated the logic device 105 and the memory device 110, the sequential test flow sequence 135 is conventionally used, where testing of the logic device 105 is completed before testing of the memory device 110 begins. Alternately, the sequential test flow sequence 135 may be modified to complete testing of the memory device 110 before testing of the logic device 105 begins. The test vectors and test flows for the sequential test flow sequence 135 may be the same test vectors and test flows used to test the logic device 105 and/or the memory device 110 when the devices are individually packaged, and, in an embodiment, the test vectors and test flows are executed without modification. In other words, the same timing, the same signal levels, and the same input and/or output configurations are used during the sequential test flow sequence 135 to test the logic device 105 and/or the memory device 110 when packaged in the system package 100 as when the logic device 105 and/or the memory device 110 are individually packaged.

During logic initialization 122 and while the tests 131, 132, and 134 are executed on the logic device 105, the memory device 110 is idle for memory wait 133. In an embodiment, the logic initialization 122 prepares the test controller 125 to first execute test programs on the logic device 105 followed by execution of a memory test program on the memory device 110 via the signals 120. In another embodiment, the logic initialization 122 prepares the test controller 125 to first execute a memory test program on the memory device 110 via the signals 120 and then execute test programs on the logic device 105. The tests 131, 132, and 134 may include test vectors for the modules 111, 113 and 114, and 116, respectively. In an embodiment, the modules 113 and 114 may be tested concurrently because modules 113 and 114 have independent inputs and outputs. After the tests 131, 132, and 134 are complete, a memory test 138 is executed on the memory device and the logic device 105 is idle for logic wait 124.

A test flow sequence 136 implements concurrent testing of the logic device 105 and the memory device 110. During logic initialization 122, the memory device 110 is idle for memory wait 137. Similarly, during memory initialization 139, the logic device is idle for logic wait 123. In an embodiment, the logic initialization 122 prepares the test controller 125 to execute test programs on the logic device 105. In an embodiment, the memory initialization 139 configures the test engine 115, via the signals 120, to start a free running clock for reading and/or writing memory cells and then execute a memory test program on the memory device 110. In another embodiment, the order of the logic initialization 122 and the memory initialization 139 is reversed.

When the system package 100 includes the direct access memory test input so that the logic initialization 122 and the memory initialization 139 do not access the same inputs and/or outputs, the logic initialization 122 and the memory initialization 139 may be executed concurrently. The tests 131, 132, and 134 may be executed in sequence on the logic device 105 concurrently with execution of the memory test 138 on the memory device 110. The test flow is flexible because the tests 131, 132, and 134 may be executed in a different sequence or multiple times.

In an embodiment, the memory test 138 requires hundreds of millions of cycles to complete execution of the memory test 138. After the memory test 138 is completed, test results may be transmitted from the test engine 115 to the results unit 118 over the signals 120. In an embodiment, the memory device 110 is HBM2 DRAM and the memory test 138 is executed in about 10 seconds or $10^9$ cycles. When the time required to execute the memory test 138 is greater than the time required to execute the logic tests 131, 132, and 134 on the logic device 105, additional tests may be executed on the logic device 105. In an embodiment, the system package 100 includes two or more memory devices 110 and the memory initialization 138 and/or the memory test 138 is concurrently executed by the two or more memory devices 110. The FTC provides flexibility for test flow and reduces the overall test time because one or more logic tests can be run concurrently with the memory test 138.

Figure 1D:
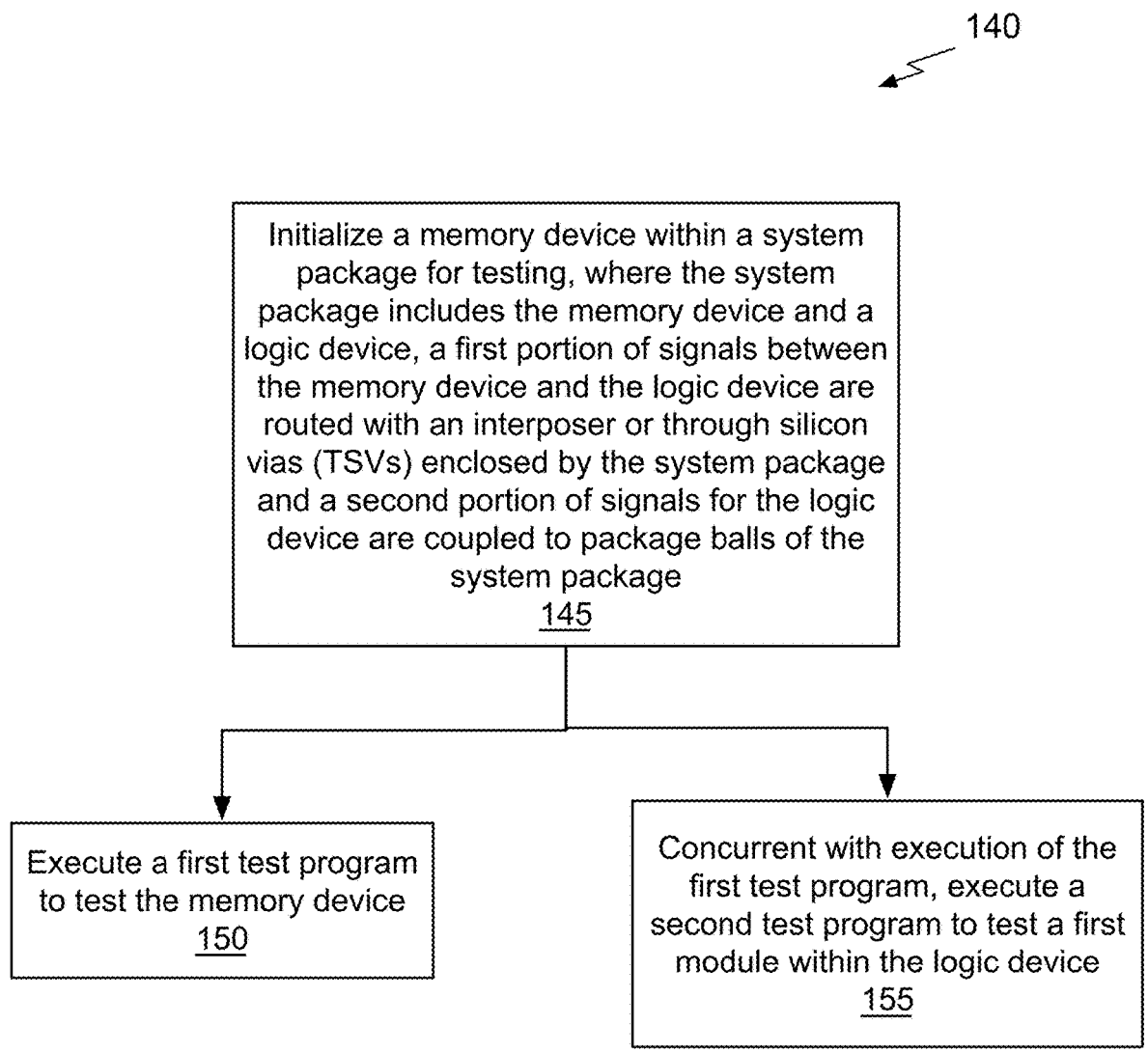
FIG. 1D illustrates a flowchart of a method for concurrently testing the logic device and the memory device within the system package shown in FIGS. 1A and 1B, in accordance with an embodiment.

FIG. 1D illustrates a flowchart of a method 140 for concurrently testing the logic device 105 and the memory device 110 within the system package 100 shown in FIGS. 1A and 1B, in accordance with an embodiment. At step 145, the memory device 110 within the system package 100 is initialized for testing, where the system package 100 includes the memory device 110 and the logic device 105.

A first portion of signals between the memory device 110 and the logic device 105 (e.g., signals 120) are routed within the interposer 102 enclosed by the system package 100 and a second portion of signals for the logic device (e.g., signals 120) are coupled to package balls 112 of the system package 100. In another embodiment, the signals 120 between the memory device 110 and the logic device 105 are routed within (TSVs) fabricated in the logic device 105 and/or memory device 110 and enclosed by the system package 100, as shown in FIG. 2C. The interposer 102 and the TSVs provide an internal interface that is isolated from the external interface of the package (e.g., inputs and/or outputs at the package balls 112).

At step 150, a first test program (e.g., memory test 138) is executed to test the memory device 110. In an embodiment, the test engine 115 initiates execution of the first test program. At step 155, concurrent with execution of the first test program, a second test program (e.g., test 131, 132, or 134) is executed to test a first module (e.g., module 111, 113, 114, and/or 116) within the logic device 105.

Although method 140 is described in the context of a processing unit, the method 140 may also be performed by a program, custom circuitry, or by a combination of custom circuitry and a program. For example, the method 140 may be executed by a GPU, CPU, ASIC, NoC (Network on Chip), or any logic device or processor capable of implementing testing of a SiP, such as the system package 100 including the logic device 105 and one or more of the memory devices 110. Furthermore, persons of ordinary skill in the art will understand that any system that performs method 140 is within the scope and spirit of embodiments of the present disclosure.

Figure 1E:
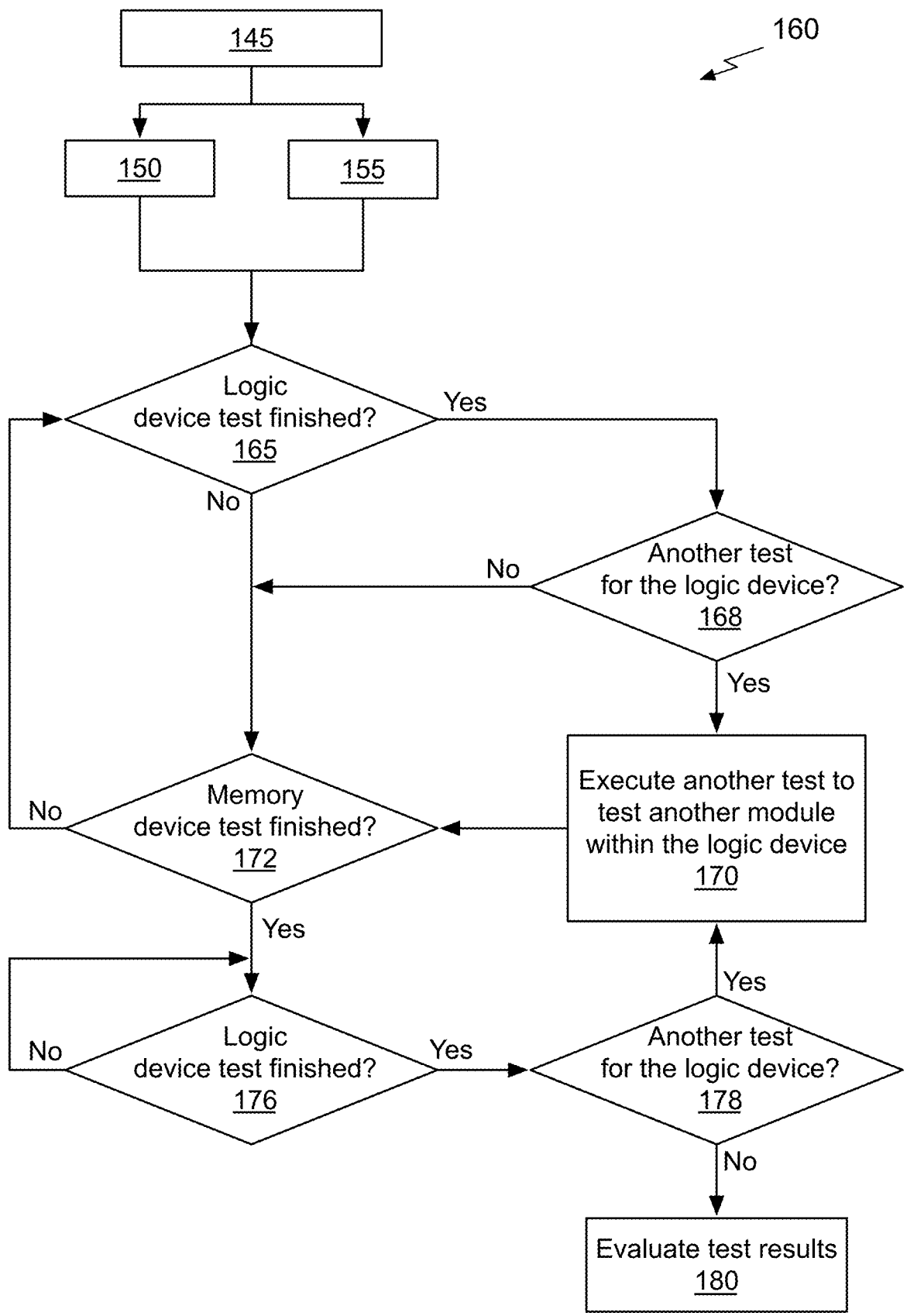
FIG. 1E illustrates a flowchart of another method for concurrently testing the logic device and the memory device within the system package shown in FIGS. 1A and 1B, in accordance with an embodiment.

FIG. 1E illustrates a flowchart of another method 160 for concurrently testing the logic device 105 and the memory device 110 within the system package 100 shown in FIGS. 1A and 1B, in accordance with an embodiment. Steps 145, 150, and 155 are completed as previously described in conjunction with FIG. 1D. Although method 160 is described in the context of a processing unit, the method 160 may also be performed by a program, custom circuitry, or by a combination of custom circuitry and a program. Persons of ordinary skill in the art will understand that any system that performs method 160 is within the scope and spirit of embodiments of the present disclosure. At step 165, the test controller 125 determines if the logic test (e.g., the second test program) is finished, and, if so, at step 168, the test controller 125 determines if another test should be executed for the logic device 105. If, at step 168, the test controller 125 determines if another logic test should be executed for the logic device 105, then at step 170 the test controller 125 executes another logic test to test another module within the logic device 105 before proceeding to step 172.

If, at step 165, the test controller 125 determines the logic test is finished, then at step 172, the test controller 125 determines if the memory device test (e.g., the first test program) is finished. If the test controller 125 determines that the memory test is not finished, then the test controller 125 returns to step 165. Otherwise, execution of the memory test 138 is complete, and, at step 176 the test controller 125 waits for the logic test to finish. When, at step 176, the test controller 125 determines that the logic test is finished, at step 178, the test controller 125 determines if another logic test should be executed for the logic device 105. If another logic test should be executed, the test controller 125 returns to step 170. In an embodiment, one or more of steps 165, 168, 170, 172, 176, and 178 are performed by a combination of the test controller 125 and a program. Otherwise, testing of the logic device 105 and the memory device 110 within the system package 100 is complete, and, at step 180 the results unit 118 evaluates the test results. In an embodiment, step 180 is performed by a combination of the results unit 118 and a program.

Figure 2A:
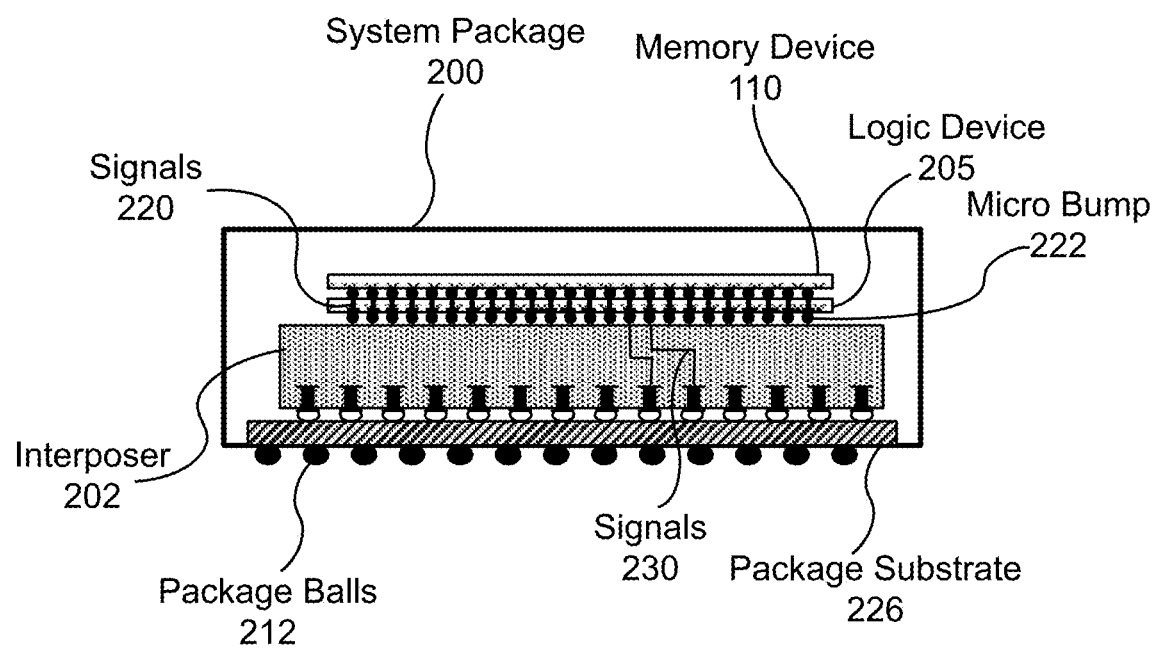
FIG. 2A illustrates another system package including a stacked logic device and a memory device, in accordance with an embodiment.

FIG. 2A illustrates a system package 200 including a stacked logic device 205 and a memory device 110, in accordance with an embodiment. Like the logic device 105, the logic 205 is a processor. However, the logic device 205 is fabricated to include TSVs enabling another device (e.g., the memory device 110) to be coupled to the top side of the logic device 205. Therefore, signals 220 between the logic device 205 and the memory device 110 are transmitted through the TSVs within the logic device 205 instead of through an interposer 202.

As shown in FIG. 2A, the logic device 205 and the memory device 110 are separate die and only the logic device 205 is attached to the interposer 202 by micro bumps 222. The logic device 205 may be coupled to the interposer 115 using the same mechanism by which the logic device 105 is coupled to the interposer 102. In an embodiment, the interposer 202 is a silicon substrate within which electrical connections are fabricated to electrically couple one or more inputs and/or outputs of the logic device 205 to package balls 212 through a package substrate 226. The interposer 202 is mounted on top of a package substrate 226. The package substrate 226 provides mechanical support and electrical connections between signals 230 within the interposer 115 and the package balls 212. Signals 230 for inputs and/or output of the logic device 205 are also inputs and/or outputs of the system package 200 and the signals 230 may be accessed at the package balls 212. In contrast, the signals 220 cannot be accessed at the package balls 212.

Figure 2B:
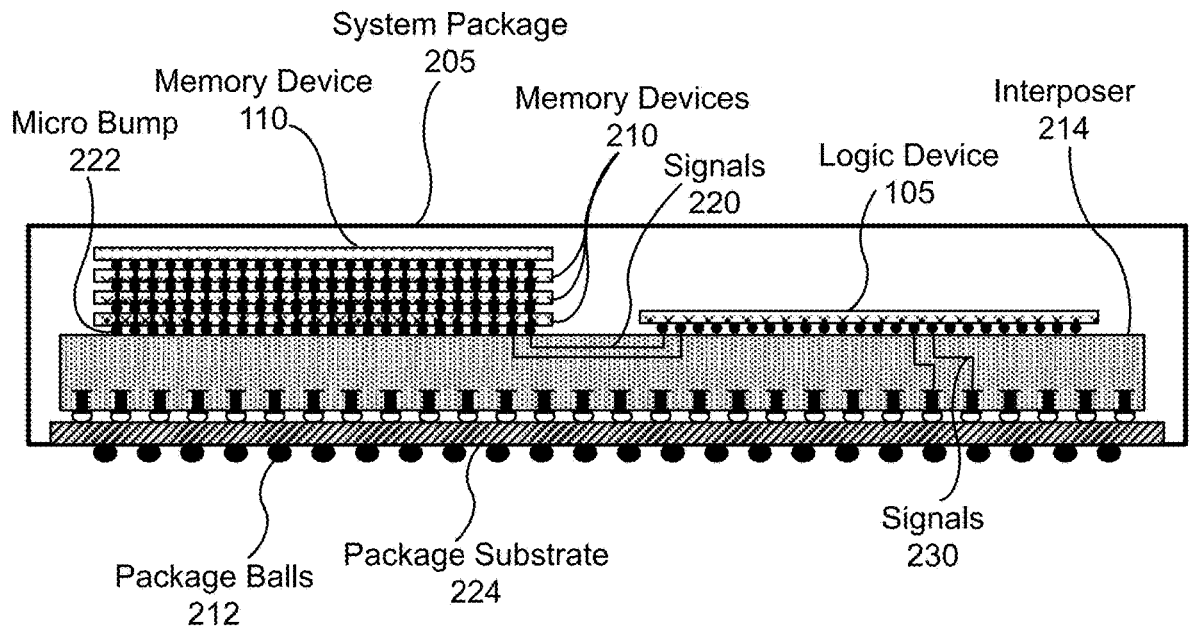
FIG. 2B illustrates a system package including a logic device and stacked memory devices, in accordance with an embodiment.
Figure 2C:
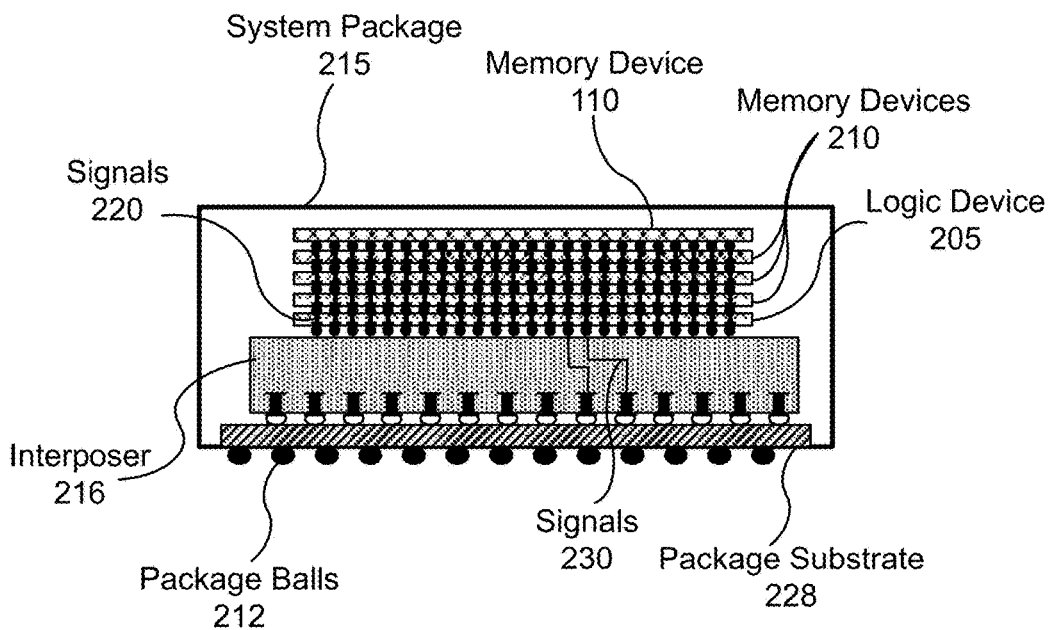
FIG. 2C illustrates another system package including a stacked logic device and memory device(s), in accordance with an embodiment.

FIG. 2B illustrates a system package 205 including a logic device 105 and stacked memory devices 210 and 110, in accordance with an embodiment. The logic device 105 is coupled through signals 220 to a stack of memory devices including memory devices 210 and 110. Like the memory device 110, the memory devices 210 are memory storage circuits. However, the memory devices 210 are fabricated to include TSVs enabling another device (e.g., the memory device 110 or another memory device 210) to be coupled to the top side of the memory device 210. Therefore, signals 220 between the logic device 205 and the memory device 110 are transmitted through the TSVs within the memory devices 210 and are also transmitted through an interposer 214.

As shown in FIG. 2B, the logic device 105 and the memory devices 210 and 110 are separate die and the logic device 105 and the bottom memory device 210 are each attached to the interposer 214 by micro bumps 222. In an embodiment, the interposer 214 is a silicon substrate within which electrical connections are fabricated to electrically couple one or more inputs and/or outputs of the logic device 105 to package balls 212 through a package substrate 224. The interposer 214 is mounted on top of a package substrate 224. The package substrate 224 provides mechanical support and electrical connections between signals 230 within the interposer 115 and the package balls 212. Signals 230 for inputs and/or output of the logic device 105 are also inputs and/or outputs of the system package 205 and the signals 230 may be accessed at the package balls 212. In contrast, the signals 220 cannot be accessed at the package balls 212.

The memory devices 210 and 110 may be HBMs arranged in a stack of multiple dies. When the memory devices 210 and 110 are stacked, the memory devices 210 and 110 in the same stack may be tested concurrently through the shared signals 220. In an embodiment, the logic device 105 is also coupled to a second stack of memory devices 210 and 110 (not shown) at a second site on the interposer 214. Each site may be configured to be independent from each other in terms of test resource usage and function. Therefore, multiple stacks of memory devices 210 and 110 may also be tested concurrently. In an embodiment, the bottom memory device 210 includes a memory controller (or memory management) module that is coupled to the logic device 105 through the signals 220 and the bottom memory device 210 to the other memory devices 210 and 110 by the TSVs.

FIG. 2C illustrates another system package 215 including a stacked logic device 205 and memory device(s) 210 and 110, in accordance with an embodiment. The logic device 205 is fabricated to include TSVs enabling another device (e.g., the memory device 210) to be coupled to the top side of the logic device 205. Therefore, signals 220 between the logic device 205 and the memory device 210 are transmitted through the TSVs within the logic device 205 instead of through an interposer 216.

As shown in FIG. 2C, the logic device 205 and memory devices 210 and 110 are separate die that are vertically stacked upon each other and only the logic device 205 is attached to the interposer 216 by micro bumps 222. The logic device 205 may be coupled to the interposer 216 using the same mechanism by which the logic device 105 is coupled to the interposer 102. In an embodiment, the interposer 216 is a silicon substrate within which electrical connections are fabricated to electrically couple one or more inputs and/or outputs of the logic device 205 to package balls 212 through a package substrate 228. The interposer 216 is mounted on top of the package substrate 228. The package substrate 228 provides mechanical support and electrical connections between signals 230 within the interposer 216 and the package balls 212. Signals 230 for inputs and/or output of the logic device 205 are also inputs and/or outputs of the system package 215 and the signals 230 may be accessed at the package balls 212. In contrast, the signals 220 cannot be accessed at the package balls 212.

The memory devices 210 and 110 may be HBMs arranged in a stack of multiple dies. When the memory devices 210 and 110 are stacked, the memory devices 210 and 110 in the same stack may be tested concurrently through the shared signals 220. In an embodiment, the logic device 205 is also coupled to a second stack of memory devices 210 and 110 (not shown) at a second site on the interposer 216. Each site may be configured to be independent from each other in terms of test resource usage and function. Therefore, multiple stacks of memory devices 210 and 110 may also be tested concurrently. In an embodiment, the bottom memory device 210 includes a memory controller (or memory management) module that is coupled to the logic device 205 through the signals 220 and the bottom memory device 210 to the other memory devices 210 and 110 by the TSVs.

Figure 2D:
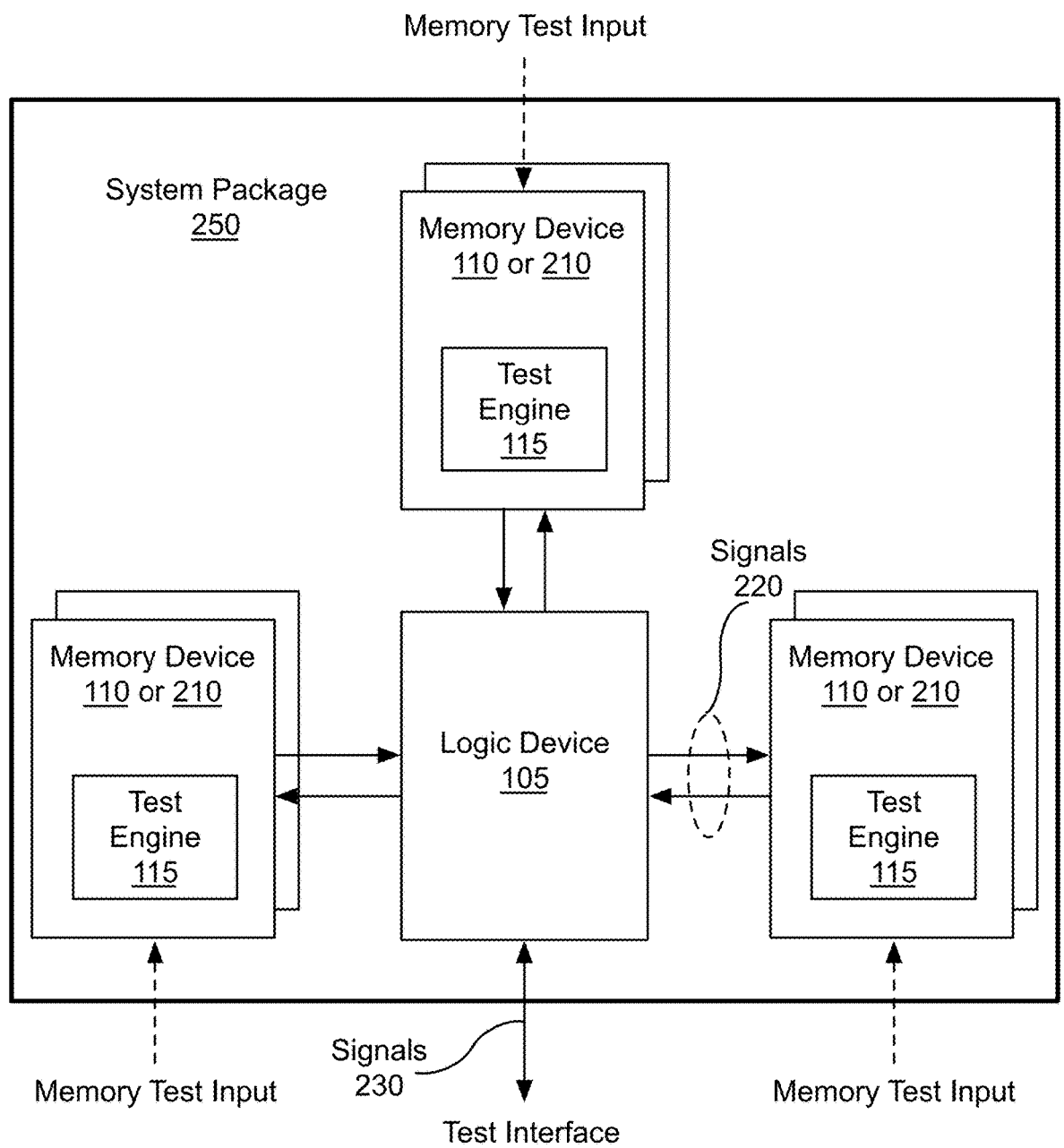
FIG. 2D illustrates another block diagram of the logic device and the stacked memory devices within a system package, in accordance with an embodiment.

FIG. 2D illustrates another block diagram of the logic device 105 and the stacked memory devices 110 and 210 within a system package 250, in accordance with an embodiment. In an embodiment, the test engine 115 is a BIST module that is concurrently initialized and concurrently executes the memory test program for each respective memory device 110 and 210 in a stack within the system package 250. In an embodiment, the logic device 105 is coupled to 8 stacks of memory devices 210 and 110.

The memory test 138 may be executed by one or more of the memory devices 110 and 210 concurrently with execution of one or more logic tests (e.g., test 131, 132, and 134) to test the modules 111, 113, 114, and 116 within the logic device 105. The test controller 125 initiates execution of the logic initialization 122 and the logic tests. The memory test 138 may be executed in parallel (e.g. concurrently) with one or more of the logic tests because the ports (inputs and/or outputs) of the logic device 105 accessed for execution of the logic tests are not also accessed for execution of the memory test 138.

The test interface includes the signals 230 for communication with the logic device 105. In an embodiment, the test controller 125 within the logic device 105 communicates with the test engine 115 within each memory device 110 or 210 through the signals 220 to execute the memory initialization 139 and the memory test 138. In an embodiment, the test engine 115 is a BIST module that is initialized by the test controller 125 within the logic device 105 and the test engine 115 executes the memory test 138 for the memory devices 210 and/or 110. In an embodiment, the signals 220 implement an IEEE 1500 interface. In an embodiment, the wires or connections used to transmit the signals 220 during testing are repurposed for use during normal operation.

Each stack of memory devices 210 and 110 may include a memory test input in addition to signals 220 between the stack and the logic device 105. In an embodiment, memory test input is a direct access memory test input that is used to initiate execution of the memory test program by the test engine 115. The memory test input is coupled to a set of package balls of the system package 250. In an embodiment, the memory test port is only used to execute the memory initialization 139 and the test controller 125 within the logic device 105 communicates with the test engine 115 within each memory device 110 or 210 through the signals 220 to execute the memory test 138. In an embodiment, the memory test port is not accessed during execution of the memory test 138.

When execution of the memory test 138 is complete, test results indicating the presence or absence of faults in each of the memory devices 210 and 110 are sent from the respective test engine 115 to the logic device 105 through the signals 220. The test results may be evaluated and stored in the results unit 118 within the logic device 105. The test results may be stored during execution of the memory test 138 or when execution of the memory test 138 is complete. In an embodiment, the test results that are stored, and any status produced by evaluation of the test results, may be accessed through the test interface. The test results may be used to perform binning of the system package 250 or to repair the logic device 105 or one or more of the memory devices 210 and 110. The system package 250 may be binned, based on the test results, for operation at different frequencies, performance, power characteristics, functions, and the like.

The FTC framework for the logic devices 105 and 205 and memory devices 110 and 210 within a system package 100, 200, 205, 215, or 250 enable concurrent execution of logic tests and memory tests without requiring changes to the test setup files. More specifically, the timing, levels, and/or pin configurations may be used without modification and the same test equipment hardware may also be used with no change compared with when the logic tests and memory tests are executed sequentially. Concurrent execution enables a reduction in the overall test time for the system package 100, 200, 205, 215, or 250.

Therefore, the test cost is reduced and the real operational power and speed of the logic device 105 or 205 may be observed while simultaneous operation of the logic device 105 or 205 and the memory devices 110 and 210 emulates a real use case. In addition to reducing the overall test time for the system package 100, 200, 205, 215, or 250 fault coverage may also be improved using the FTC framework compared with using a conventional boundary scan test technique.

Parallel Processing Architecture

Figure 3:
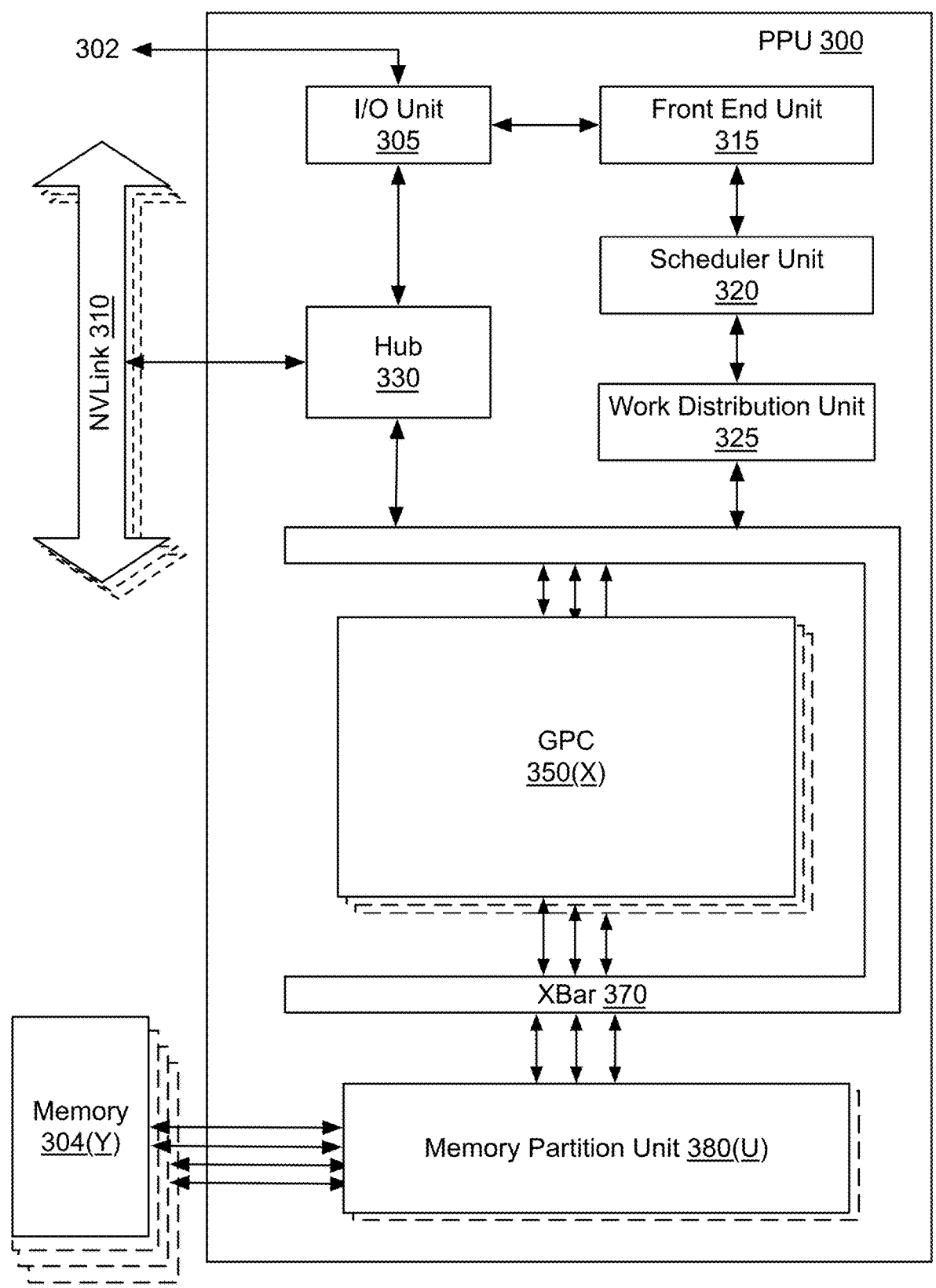
FIG. 3 illustrates a parallel processing unit, in accordance with an embodiment.

FIG. 3 illustrates a parallel processing unit (PPU) 300, in accordance with an embodiment. In an embodiment, the PPU 300 is a multi-threaded processor that is implemented on one or more integrated circuit devices. The PPU 300 is a latency hiding architecture designed to process many threads in parallel. A thread (e.g., a thread of execution) is an instantiation of a set of instructions configured to be executed by the PPU 300. In an embodiment, the PPU 300 is a graphics processing unit (GPU) configured to implement a graphics rendering pipeline for processing three-dimensional (3D) graphics data in order to generate two-dimensional (2D) image data for display on a display device such as a liquid crystal display (LCD) device. In other embodiments, the PPU 300 may be utilized for performing general-purpose computations. While one exemplary parallel processor is provided herein for illustrative purposes, it should be strongly noted that such processor is set forth for illustrative purposes only, and that any processor may be employed to supplement and/or substitute for the same.

One or more PPUs 300 may be configured to accelerate thousands of High Performance Computing (HPC), data center, and machine learning applications. The PPU 300 may be configured to accelerate numerous deep learning systems and applications including autonomous vehicle platforms, deep learning, high-accuracy speech, image, and text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and the like.

As shown in FIG. 3, the PPU 300 includes an Input/Output (I/O) unit 305, a front end unit 315, a scheduler unit 320, a work distribution unit 325, a hub 330, a crossbar (Xbar) 370, one or more general processing clusters (GPCs) 350, and one or more memory partition units 380. The PPU 300 may be connected to a host processor or other PPUs 300 via one or more high-speed NVLink 310 interconnect. The PPU 300 may be connected to a host processor or other peripheral devices via an interconnect 302. The PPU 300 may also be connected to a local memory 304 comprising a number of memory devices. In an embodiment, the local memory may comprise a number of dynamic random access memory (DRAM) devices. The DRAM devices may be configured as a high-bandwidth memory (HBM) subsystem, with multiple DRAM dies stacked within each device.

The NVLink 310 interconnect enables systems to scale and include one or more PPUs 300 combined with one or more CPUs, supports cache coherence between the PPUs 300 and CPUs, and CPU mastering. Data and/or commands may be transmitted by the NVLink 310 through the hub 330 to/from other units of the PPU 300 such as one or more copy engines, a video encoder, a video decoder, a power management unit, etc. (not explicitly shown). The NVLink 310 is described in more detail in conjunction with FIG. 5B.

The I/O unit 305 is configured to transmit and receive communications (e.g., commands, data, etc.) from a host processor (not shown) over the interconnect 302. The I/O unit 305 may communicate with the host processor directly via the interconnect 302 or through one or more intermediate devices such as a memory bridge. In an embodiment, the I/O unit 305 may communicate with one or more other processors, such as one or more the PPUs 300 via the interconnect 302. In an embodiment, the I/O unit 305 implements a Peripheral Component Interconnect Express (PCIe) interface for communications over a PCIe bus and the interconnect 302 is a PCIe bus. In alternative embodiments, the I/O unit 305 may implement other types of well-known interfaces for communicating with external devices.

The I/O unit 305 decodes packets received via the interconnect 302. In an embodiment, the packets represent commands configured to cause the PPU 300 to perform various operations. The I/O unit 305 transmits the decoded commands to various other units of the PPU 300 as the commands may specify. For example, some commands may be transmitted to the front end unit 315. Other commands may be transmitted to the hub 330 or other units of the PPU 300 such as one or more copy engines, a video encoder, a video decoder, a power management unit, etc. (not explicitly shown). In other words, the I/O unit 305 is configured to route communications between and among the various logical units of the PPU 300.

In an embodiment, a program executed by the host processor encodes a command stream in a buffer that provides workloads to the PPU 300 for processing. A workload may comprise several instructions and data to be processed by those instructions. The buffer is a region in a memory that is accessible (e.g., read/write) by both the host processor and the PPU 300. For example, the I/O unit 305 may be configured to access the buffer in a system memory connected to the interconnect 302 via memory requests transmitted over the interconnect 302. In an embodiment, the host processor writes the command stream to the buffer and then transmits a pointer to the start of the command stream to the PPU 300. The front end unit 315 receives pointers to one or more command streams. The front end unit 315 manages the one or more streams, reading commands from the streams and forwarding commands to the various units of the PPU 300.

The front end unit 315 is coupled to a scheduler unit 320 that configures the various GPCs 350 to process tasks defined by the one or more streams. The scheduler unit 320 is configured to track state information related to the various tasks managed by the scheduler unit 320. The state may indicate which GPC 350 a task is assigned to, whether the task is active or inactive, a priority level associated with the task, and so forth. The scheduler unit 320 manages the execution of a plurality of tasks on the one or more GPCs 350.

The scheduler unit 320 is coupled to a work distribution unit 325 that is configured to dispatch tasks for execution on the GPCs 350. The work distribution unit 325 may track a number of scheduled tasks received from the scheduler unit 320. In an embodiment, the work distribution unit 325 manages a pending task pool and an active task pool for each of the GPCs 350. The pending task pool may comprise a number of slots (e.g., 32 slots) that contain tasks assigned to be processed by a particular GPC 350. The active task pool may comprise a number of slots (e.g., 4 slots) for tasks that are actively being processed by the GPCs 350. As a GPC 350 finishes the execution of a task, that task is evicted from the active task pool for the GPC 350 and one of the other tasks from the pending task pool is selected and scheduled for execution on the GPC 350. If an active task has been idle on the GPC 350, such as while waiting for a data dependency to be resolved, then the active task may be evicted from the GPC 350 and returned to the pending task pool while another task in the pending task pool is selected and scheduled for execution on the GPC 350.

The work distribution unit 325 communicates with the one or more GPCs 350 via XBar 370. The XBar 370 is an interconnect network that couples many of the units of the PPU 300 to other units of the PPU 300. For example, the XBar 370 may be configured to couple the work distribution unit 325 to a particular GPC 350. Although not shown explicitly, one or more other units of the PPU 300 may also be connected to the XBar 370 via the hub 330.

The tasks are managed by the scheduler unit 320 and dispatched to a GPC 350 by the work distribution unit 325. The GPC 350 is configured to process the task and generate results. The results may be consumed by other tasks within the GPC 350, routed to a different GPC 350 via the XBar 370, or stored in the memory 304. The results can be written to the memory 304 via the memory partition units 380, which implement a memory interface for reading and writing data to/from the memory 304. The results can be transmitted to another PPU 300 or CPU via the NVLink 310. In an embodiment, the PPU 300 includes a number U of memory partition units 380 that is equal to the number of separate and distinct memory devices of the memory 304 coupled to the PPU 300. A memory partition unit 380 will be described in more detail below in conjunction with FIG. 4B.

In an embodiment, a host processor executes a driver kernel that implements an application programming interface (API) that enables one or more applications executing on the host processor to schedule operations for execution on the PPU 300. In an embodiment, multiple compute applications are simultaneously executed by the PPU 300 and the PPU 300 provides isolation, quality of service (QoS), and independent address spaces for the multiple compute applications. An application may generate instructions (e.g., API calls) that cause the driver kernel to generate one or more tasks for execution by the PPU 300. The driver kernel outputs tasks to one or more streams being processed by the PPU 300. Each task may comprise one or more groups of related threads, referred to herein as a warp. In an embodiment, a warp comprises 32 related threads that may be executed in parallel. Cooperating threads may refer to a plurality of threads including instructions to perform the task and that may exchange data through shared memory. Threads and cooperating threads are described in more detail in conjunction with FIG. 5A.

Figure 4A:
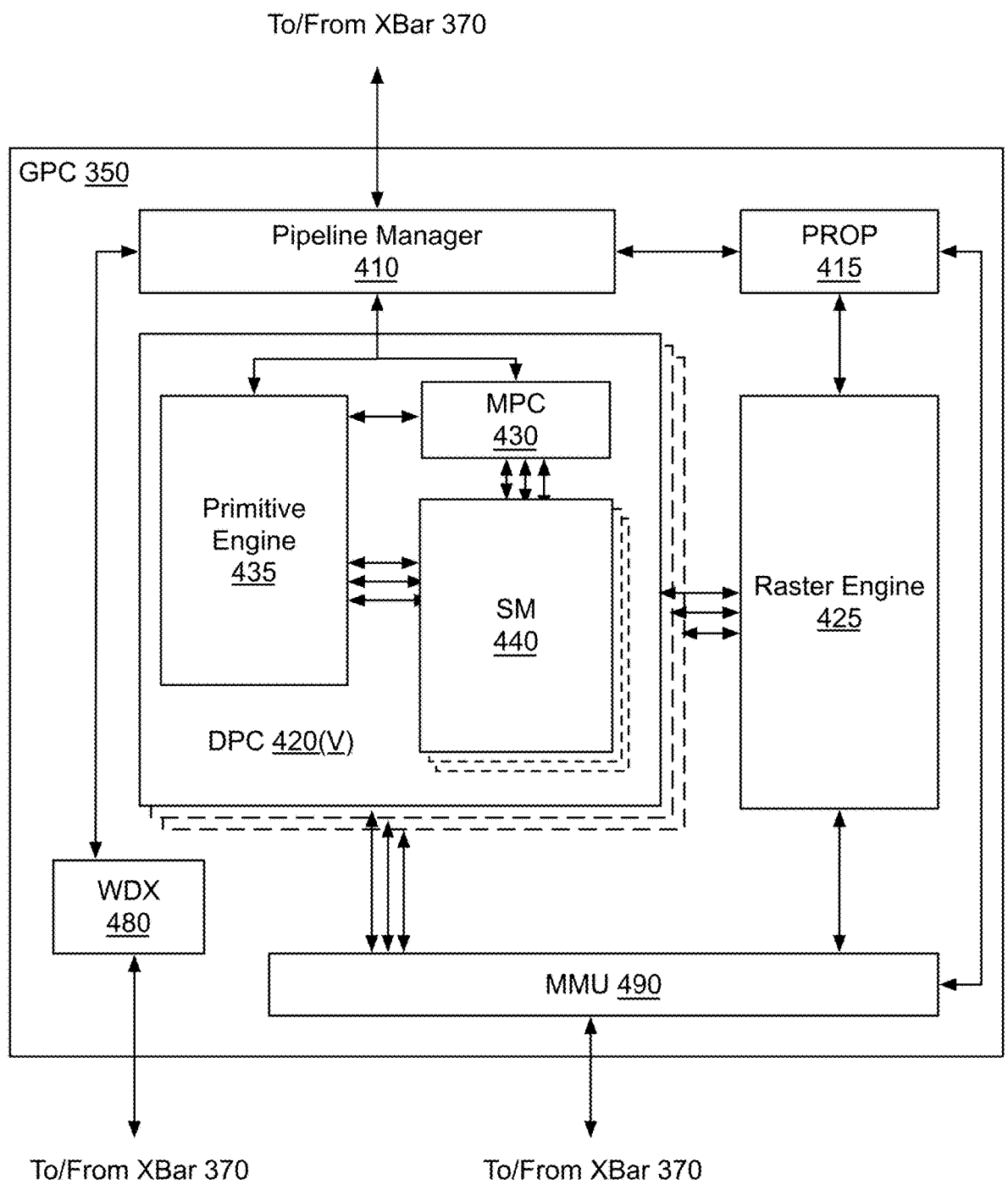
FIG. 4A illustrates a general processing cluster within the parallel processing unit of FIG. 3, in accordance with an embodiment.

FIG. 4A illustrates a GPC 350 of the PPU 300 of FIG. 3, in accordance with an embodiment. As shown in FIG. 4A, each GPC 350 includes a number of hardware units for processing tasks. In an embodiment, each GPC 350 includes a pipeline manager 410, a pre-raster operations unit (PROP) 415, a raster engine 425, a work distribution crossbar (WDX) 480, a memory management unit (MMU) 490, and one or more Data Processing Clusters (DPCs) 420. It will be appreciated that the GPC 350 of FIG. 4A may include other hardware units in lieu of or in addition to the units shown in FIG. 4A.

In an embodiment, the operation of the GPC 350 is controlled by the pipeline manager 410. The pipeline manager 410 manages the configuration of the one or more DPCs 420 for processing tasks allocated to the GPC 350. In an embodiment, the pipeline manager 410 may configure at least one of the one or more DPCs 420 to implement at least a portion of a graphics rendering pipeline. For example, a DPC 420 may be configured to execute a vertex shader program on the programmable streaming multiprocessor (SM) 440. The pipeline manager 410 may also be configured to route packets received from the work distribution unit 325 to the appropriate logical units within the GPC 350. For example, some packets may be routed to fixed function hardware units in the PROP 415 and/or raster engine 425 while other packets may be routed to the DPCs 420 for processing by the primitive engine 435 or the SM 440. In an embodiment, the pipeline manager 410 may configure at least one of the one or more DPCs 420 to implement a neural network model and/or a computing pipeline.

Figure 4B:
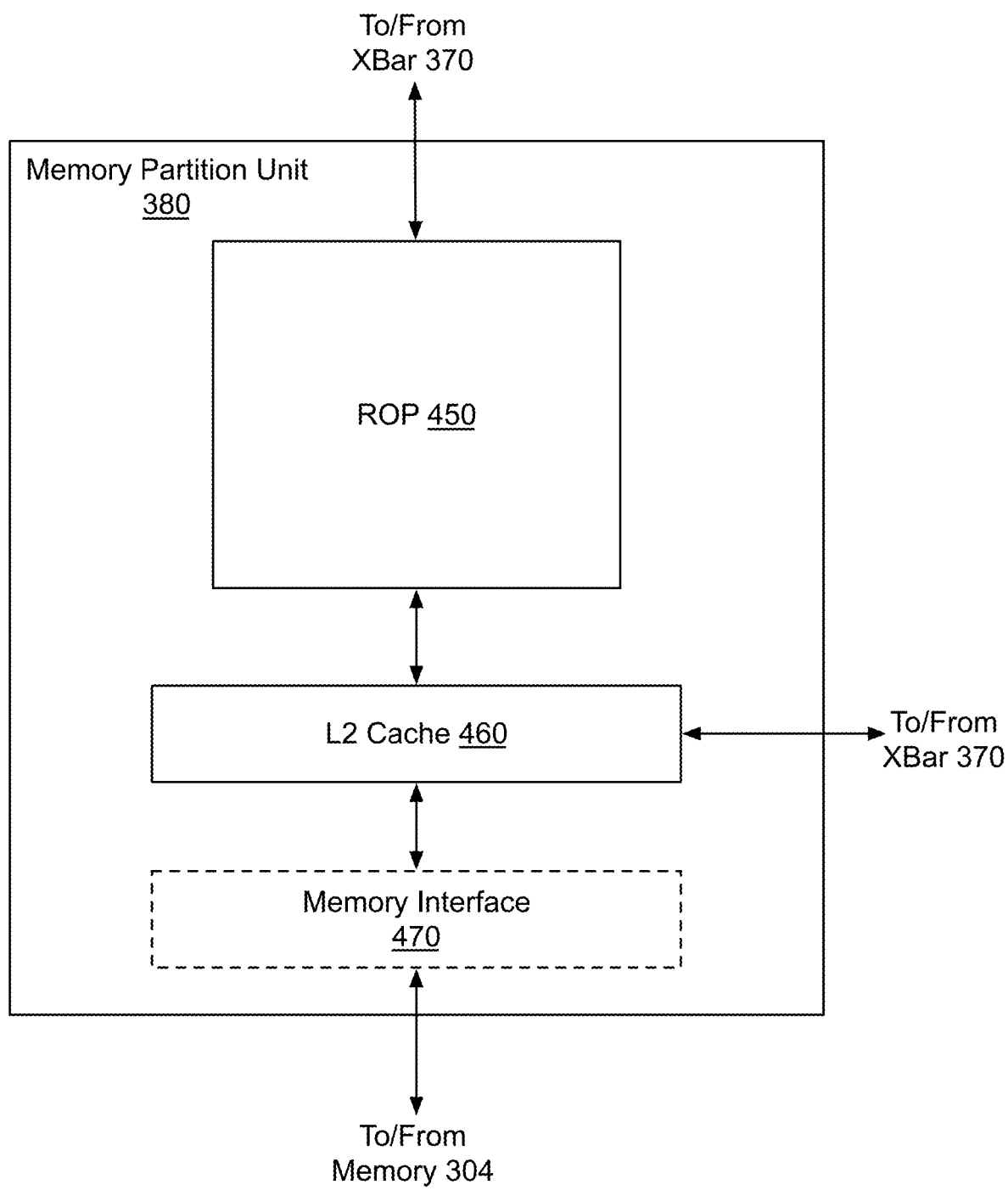
FIG. 4B illustrates a memory partition unit of the parallel processing unit of FIG. 3, in accordance with an embodiment.

The PROP unit 415 is configured to route data generated by the raster engine 425 and the DPCs 420 to a Raster Operations (ROP) unit, described in more detail in conjunction with FIG. 4B. The PROP unit 415 may also be configured to perform optimizations for color blending, organize pixel data, perform address translations, and the like.

The raster engine 425 includes a number of fixed function hardware units configured to perform various raster operations. In an embodiment, the raster engine 425 includes a setup engine, a coarse raster engine, a culling engine, a clipping engine, a fine raster engine, and a tile coalescing engine. The setup engine receives transformed vertices and generates plane equations associated with the geometric primitive defined by the vertices. The plane equations are transmitted to the coarse raster engine to generate coverage information (e.g., an x,y coverage mask for a tile) for the primitive. The output of the coarse raster engine is transmitted to the culling engine where fragments associated with the primitive that fail a z-test are culled, and transmitted to a clipping engine where fragments lying outside a viewing frustum are clipped. Those fragments that survive clipping and culling may be passed to the fine raster engine to generate attributes for the pixel fragments based on the plane equations generated by the setup engine. The output of the raster engine 425 comprises fragments to be processed, for example, by a fragment shader implemented within a DPC 420.

Each DPC 420 included in the GPC 350 includes an M-Pipe Controller (MPC) 430, a primitive engine 435, and one or more SMs 440. The MPC 430 controls the operation of the DPC 420, routing packets received from the pipeline manager 410 to the appropriate units in the DPC 420. For example, packets associated with a vertex may be routed to the primitive engine 435, which is configured to fetch vertex attributes associated with the vertex from the memory 304. In contrast, packets associated with a shader program may be transmitted to the SM 440.

The SM 440 comprises a programmable streaming processor that is configured to process tasks represented by a number of threads. Each SM 440 is multi-threaded and configured to execute a plurality of threads (e.g., 32 threads) from a particular group of threads concurrently. In an embodiment, the SM 440 implements a SIMD (Single-Instruction, Multiple-Data) architecture where each thread in a group of threads (e.g., a warp) is configured to process a different set of data based on the same set of instructions. All threads in the group of threads execute the same instructions. In another embodiment, the SM 440 implements a SIMT (Single-Instruction, Multiple Thread) architecture where each thread in a group of threads is configured to process a different set of data based on the same set of instructions, but where individual threads in the group of threads are allowed to diverge during execution. In an embodiment, a program counter, call stack, and execution state is maintained for each warp, enabling concurrency between warps and serial execution within warps when threads within the warp diverge. In another embodiment, a program counter, call stack, and execution state is maintained for each individual thread, enabling equal concurrency between all threads, within and between warps. When execution state is maintained for each individual thread, threads executing the same instructions may be converged and executed in parallel for maximum efficiency. The SM 440 will be described in more detail below in conjunction with FIG. 5A.

The MMU 490 provides an interface between the GPC 350 and the memory partition unit 380. The MMU 490 may provide translation of virtual addresses into physical addresses, memory protection, and arbitration of memory requests. In an embodiment, the MMU 490 provides one or more translation lookaside buffers (TLBs) for performing translation of virtual addresses into physical addresses in the memory 304.

FIG. 4B illustrates a memory partition unit 380 of the PPU 300 of FIG. 3, in accordance with an embodiment. As shown in FIG. 4B, the memory partition unit 380 includes a Raster Operations (ROP) unit 450, a level two (L2) cache 460, and a memory interface 470. The memory interface 470 is coupled to the memory 304. Memory interface 470 may implement 32, 64, 128, 1024-bit data buses, or the like, for high-speed data transfer. In an embodiment, the PPU 300 incorporates U memory interfaces 470, one memory interface 470 per pair of memory partition units 380, where each pair of memory partition units 380 is connected to a corresponding memory device of the memory 304. For example, PPU 300 may be connected to up to Y memory devices, such as high bandwidth memory stacks or graphics double-data-rate, version 5, synchronous dynamic random access memory, or other types of persistent storage.

In an embodiment, the memory interface 470 implements an HBMx memory interface and Y equals half U. In an embodiment, the HBMx memory stacks are located within the same physical package as the PPU 300, providing substantial power and area savings compared with conventional GDDR5 SDRAM systems. In an embodiment, each HBMx stack includes four or eight memory dies and Y equals 4, with HBMx stack including two 128-bit channels per die for a total of 8 channels and a data bus width of 1024 bits. In an embodiment, the logic device 105 or 205 is the PPU 300 and the memory devices implementing the memory 304 are memory devices 110 and/or 210.

In an embodiment, the memory 304 supports Single-Error Correcting Double-Error Detecting (SECDED) Error Correction Code (ECC) to protect data. ECC provides higher reliability for compute applications that are sensitive to data corruption. Reliability is especially important in large-scale cluster computing environments where PPUs 300 process very large datasets and/or run applications for extended periods.

In an embodiment, the PPU 300 implements a multi-level memory hierarchy. In an embodiment, the memory partition unit 380 supports a unified memory to provide a single unified virtual address space for CPU and PPU 300 memory, enabling data sharing between virtual memory systems. In an embodiment the frequency of accesses by a PPU 300 to memory located on other processors is traced to ensure that memory pages are moved to the physical memory of the PPU 300 that is accessing the pages more frequently. In an embodiment, the NVLink 310 supports address translation services allowing the PPU 300 to directly access a CPU's page tables and providing full access to CPU memory by the PPU 300.

In an embodiment, copy engines transfer data between multiple PPUs 300 or between PPUs 300 and CPUs. The copy engines can generate page faults for addresses that are not mapped into the page tables. The memory partition unit 380 can then service the page faults, mapping the addresses into the page table, after which the copy engine can perform the transfer. In a conventional system, memory is pinned (e.g., non-pageable) for multiple copy engine operations between multiple processors, substantially reducing the available memory. With hardware page faulting, addresses can be passed to the copy engines without worrying if the memory pages are resident, and the copy process is transparent.

Data from the memory 304 or other system memory may be fetched by the memory partition unit 380 and stored in the L2 cache 460, which is located on-chip and is shared between the various GPCs 350. As shown, each memory partition unit 380 includes a portion of the L2 cache 460 associated with a corresponding memory 304. Lower level caches may then be implemented in various units within the GPCs 350. For example, each of the SMs 440 may implement a level one (L1) cache. The L1 cache is private memory that is dedicated to a particular SM 440. Data from the L2 cache 460 may be fetched and stored in each of the L1 caches for processing in the functional units of the SMs 440. The L2 cache 460 is coupled to the memory interface 470 and the XBar 370.

The ROP unit 450 performs graphics raster operations related to pixel color, such as color compression, pixel blending, and the like. The ROP unit 450 also implements depth testing in conjunction with the raster engine 425, receiving a depth for a sample location associated with a pixel fragment from the culling engine of the raster engine 425. The depth is tested against a corresponding depth in a depth buffer for a sample location associated with the fragment. If the fragment passes the depth test for the sample location, then the ROP unit 450 updates the depth buffer and transmits a result of the depth test to the raster engine 425. It will be appreciated that the number of memory partition units 380 may be different than the number of GPCs 350 and, therefore, each ROP unit 450 may be coupled to each of the GPCs 350. The ROP unit 450 tracks packets received from the different GPCs 350 and determines which GPC 350 that a result generated by the ROP unit 450 is routed to through the Xbar 370. Although the ROP unit 450 is included within the memory partition unit 380 in FIG. 4B, in other embodiment, the ROP unit 450 may be outside of the memory partition unit 380. For example, the ROP unit 450 may reside in the GPC 350 or another unit.

Figure 5A:
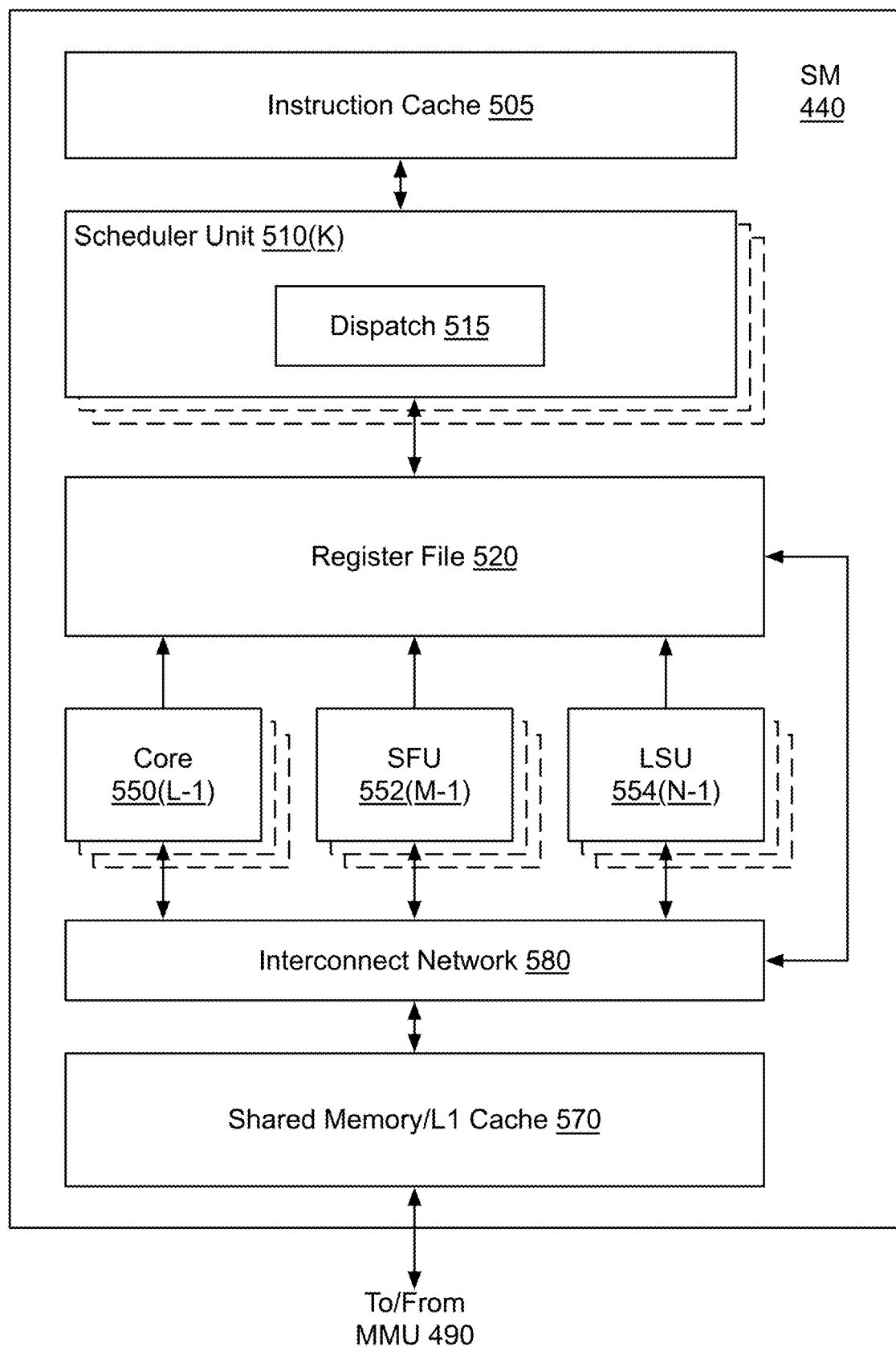
FIG. 5A illustrates the streaming multi-processor of FIG. 4A, in accordance with an embodiment.

FIG. 5A illustrates the streaming multi-processor 440 of FIG. 4A, in accordance with an embodiment. As shown in FIG. 5A, the SM 440 includes an instruction cache 505, one or more scheduler units 510, a register file 520, one or more processing cores 550, one or more special function units (SFUs) 552, one or more load/store units (LSUs) 554, an interconnect network 580, a shared memory/L1 cache 570.

As described above, the work distribution unit 325 dispatches tasks for execution on the GPCs 350 of the PPU 300. The tasks are allocated to a particular DPC 420 within a GPC 350 and, if the task is associated with a shader program, the task may be allocated to an SM 440. The scheduler unit 510 receives the tasks from the work distribution unit 325 and manages instruction scheduling for one or more thread blocks assigned to the SM 440. The scheduler unit 510 schedules thread blocks for execution as warps of parallel threads, where each thread block is allocated at least one warp. In an embodiment, each warp executes 32 threads. The scheduler unit 510 may manage a plurality of different thread blocks, allocating the warps to the different thread blocks and then dispatching instructions from the plurality of different cooperative groups to the various functional units (e.g., cores 550, SFUs 552, and LSUs 554) during each clock cycle.

Cooperative Groups is a programming model for organizing groups of communicating threads that allows developers to express the granularity at which threads are communicating, enabling the expression of richer, more efficient parallel decompositions. Cooperative launch APIs support synchronization amongst thread blocks for the execution of parallel algorithms. Conventional programming models provide a single, simple construct for synchronizing cooperating threads: a barrier across all threads of a thread block (e.g., the syncthreads( ) function). However, programmers would often like to define groups of threads at smaller than thread block granularities and synchronize within the defined groups to enable greater performance, design flexibility, and software reuse in the form of collective group-wide function interfaces.

Cooperative Groups enables programmers to define groups of threads explicitly at sub-block (e.g., as small as a single thread) and multi-block granularities, and to perform collective operations such as synchronization on the threads in a cooperative group. The programming model supports clean composition across software boundaries, so that libraries and utility functions can synchronize safely within their local context without having to make assumptions about convergence. Cooperative Groups primitives enable new patterns of cooperative parallelism, including producer-consumer parallelism, opportunistic parallelism, and global synchronization across an entire grid of thread blocks.

A dispatch unit 515 is configured to transmit instructions to one or more of the functional units. In the embodiment, the scheduler unit 510 includes two dispatch units 515 that enable two different instructions from the same warp to be dispatched during each clock cycle. In alternative embodiments, each scheduler unit 510 may include a single dispatch unit 515 or additional dispatch units 515.

Each SM 440 includes a register file 520 that provides a set of registers for the functional units of the SM 440. In an embodiment, the register file 520 is divided between each of the functional units such that each functional unit is allocated a dedicated portion of the register file 520. In another embodiment, the register file 520 is divided between the different warps being executed by the SM 440. The register file 520 provides temporary storage for operands connected to the data paths of the functional units.

Each SM 440 comprises L processing cores 550. In an embodiment, the SM 440 includes a large number (e.g., 128, etc.) of distinct processing cores 550. Each core 550 may include a fully-pipelined, single-precision, double-precision, and/or mixed precision processing unit that includes a floating point arithmetic logic unit and an integer arithmetic logic unit. In an embodiment, the floating point arithmetic logic units implement the IEEE 754-2008 standard for floating point arithmetic. In an embodiment, the cores 550 include 64 single-precision (32-bit) floating point cores, 64 integer cores, 32 double-precision (64-bit) floating point cores, and 8 tensor cores.

Tensor cores configured to perform matrix operations, and, in an embodiment, one or more tensor cores are included in the cores 550. In particular, the tensor cores are configured to perform deep learning matrix arithmetic, such as convolution operations for neural network training and inferencing. In an embodiment, each tensor core operates on a 4×4 matrix and performs a matrix multiply and accumulate operation D=A×B+C, where A, B, C, and D are 4×4 matrices.

In an embodiment, the matrix multiply inputs A and B are 16-bit floating point matrices, while the accumulation matrices C and D may be 16-bit floating point or 32-bit floating point matrices. Tensor Cores operate on 16-bit floating point input data with 32-bit floating point accumulation. The 16-bit floating point multiply requires 64 operations and results in a full precision product that is then accumulated using 32-bit floating point addition with the other intermediate products for a 4×4×4 matrix multiply. In practice, Tensor Cores are used to perform much larger two-dimensional or higher dimensional matrix operations, built up from these smaller elements. An API, such as CUDA 9 C++ API, exposes specialized matrix load, matrix multiply and accumulate, and matrix store operations to efficiently use Tensor Cores from a CUDA-C++ program. At the CUDA level, the warp-level interface assumes 16×16 size matrices spanning all 32 threads of the warp.

Each SM 440 also comprises M SFUs 552 that perform special functions (e.g., attribute evaluation, reciprocal square root, and the like). In an embodiment, the SFUs 552 may include a tree traversal unit configured to traverse a hierarchical tree data structure. In an embodiment, the SFUs 552 may include texture unit configured to perform texture map filtering operations. In an embodiment, the texture units are configured to load texture maps (e.g., a 2D array of texels) from the memory 304 and sample the texture maps to produce sampled texture values for use in shader programs executed by the SM 440. In an embodiment, the texture maps are stored in the shared memory/L1 cache 470. The texture units implement texture operations such as filtering operations using mip-maps (e.g., texture maps of varying levels of detail). In an embodiment, each SM 340 includes two texture units.

Each SM 440 also comprises N LSUs 554 that implement load and store operations between the shared memory/L1 cache 570 and the register file 520. Each SM 440 includes an interconnect network 580 that connects each of the functional units to the register file 520 and the LSU 554 to the register file 520, shared memory/L1 cache 570. In an embodiment, the interconnect network 580 is a crossbar that can be configured to connect any of the functional units to any of the registers in the register file 520 and connect the LSUs 554 to the register file and memory locations in shared memory/L1 cache 570.

The shared memory/L1 cache 570 is an array of on-chip memory that allows for data storage and communication between the SM 440 and the primitive engine 435 and between threads in the SM 440. In an embodiment, the shared memory/L1 cache 570 comprises 128 KB of storage capacity and is in the path from the SM 440 to the memory partition unit 380. The shared memory/L1 cache 570 can be used to cache reads and writes. One or more of the shared memory/L1 cache 570, L2 cache 460, and memory 304 are backing stores.

Combining data cache and shared memory functionality into a single memory block provides the best overall performance for both types of memory accesses. The capacity is usable as a cache by programs that do not use shared memory. For example, if shared memory is configured to use half of the capacity, texture and load/store operations can use the remaining capacity. Integration within the shared memory/L1 cache 570 enables the shared memory/L1 cache 570 to function as a high-throughput conduit for streaming data while simultaneously providing high-bandwidth and low-latency access to frequently reused data.

When configured for general purpose parallel computation, a simpler configuration can be used compared with graphics processing. Specifically, the fixed function graphics processing units shown in FIG. 3, are bypassed, creating a much simpler programming model. In the general purpose parallel computation configuration, the work distribution unit 325 assigns and distributes blocks of threads directly to the DPCs 420. The threads in a block execute the same program, using a unique thread ID in the calculation to ensure each thread generates unique results, using the SM 440 to execute the program and perform calculations, shared memory/L1 cache 570 to communicate between threads, and the LSU 554 to read and write global memory through the shared memory/L1 cache 570 and the memory partition unit 380. When configured for general purpose parallel computation, the SM 440 can also write commands that the scheduler unit 320 can use to launch new work on the DPCs 420.

The PPU 300 may be included in a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, and the like. In an embodiment, the PPU 300 is embodied on a single semiconductor substrate. In another embodiment, the PPU 300 is included in a system-on-a-chip (SoC) along with one or more other devices such as additional PPUs 300, the memory 304, a reduced instruction set computer (RISC) CPU, a memory management unit (MMU), a digital-to-analog converter (DAC), and the like.

In an embodiment, the PPU 300 may be included on a graphics card that includes one or more memory devices. The graphics card may be configured to interface with a PCIe slot on a motherboard of a desktop computer. In yet another embodiment, the PPU 300 may be an integrated graphics processing unit (iGPU) or parallel processor included in the chipset of the motherboard.

Exemplary Computing System

Systems with multiple GPUs and CPUs are used in a variety of industries as developers expose and leverage more parallelism in applications such as artificial intelligence computing. High-performance GPU-accelerated systems with tens to many thousands of compute nodes are deployed in data centers, research facilities, and supercomputers to solve ever larger problems. As the number of processing devices within the high-performance systems increases, the communication and data transfer mechanisms need to scale to support the increased bandwidth.

Figure 5B:
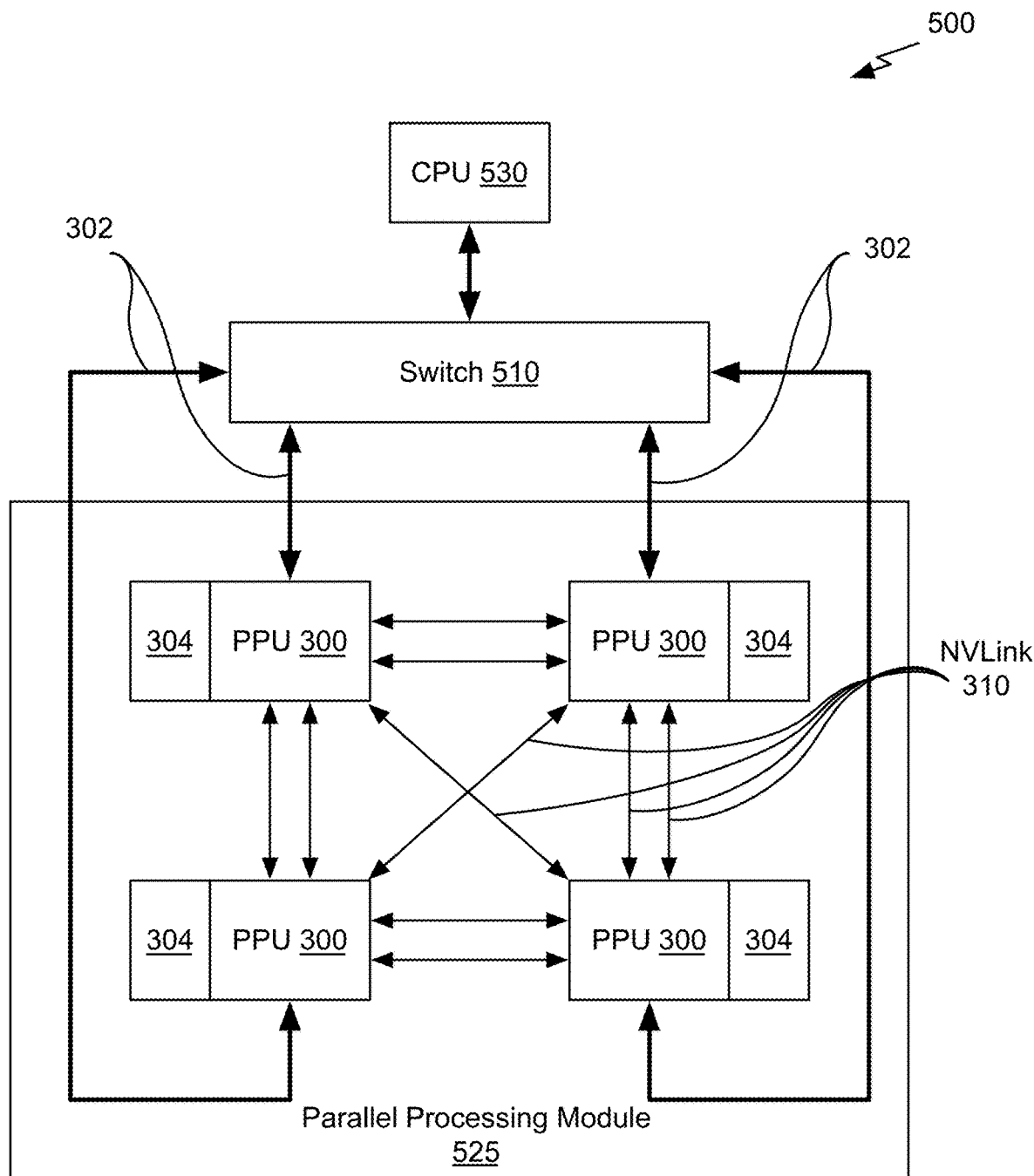
FIG. 5B is a conceptual diagram of a processing system implemented using the PPU of FIG. 3, in accordance with an embodiment.

FIG. 5B is a conceptual diagram of a processing system 500 implemented using the PPU 300 of FIG. 3, in accordance with an embodiment. The exemplary system 565 may be configured to implement the method 140 shown in FIG. 1D and/or the method 160 shown in FIG. 1E. The processing system 500 includes a CPU 530, switch 510, and multiple PPUs 300, and respective memories 304. The NVLink 310 provides high-speed communication links between each of the PPUs 300. Although a particular number of NVLink 310 and interconnect 302 connections are illustrated in FIG. 5B, the number of connections to each PPU 300 and the CPU 530 may vary. The switch 510 interfaces between the interconnect 302 and the CPU 530. The PPUs 300, memories 304, and NVLinks 310 may be situated on a single semiconductor platform to form a parallel processing module 525. For example, the PPUs 300, memories 304, and NVLinks 310 may be implemented in a single system package such as the system package 100, 200, 205, 215, and/or 250. The memories 304 and PPUs 300 may be concurrently tested using the FTC framework after assembly into the single system package. In an embodiment, the switch 510 supports two or more protocols to interface between various different connections and/or links.

In another embodiment (not shown), the NVLink 310 provides one or more high-speed communication links between each of the PPUs 300 and the CPU 530 and the switch 510 interfaces between the interconnect 302 and each of the PPUs 300. The PPUs 300, memories 304, and interconnect 302 may be situated on a single semiconductor platform to form a parallel processing module 525. In yet another embodiment (not shown), the interconnect 302 provides one or more communication links between each of the PPUs 300 and the CPU 530 and the switch 510 interfaces between each of the PPUs 300 using the NVLink 310 to provide one or more high-speed communication links between the PPUs 300. In another embodiment (not shown), the NVLink 310 provides one or more high-speed communication links between the PPUs 300 and the CPU 530 through the switch 510. In yet another embodiment (not shown), the interconnect 302 provides one or more communication links between each of the PPUs 300 directly. One or more of the NVLink 310 high-speed communication links may be implemented as a physical NVLink interconnect or either an on-chip or on-die interconnect using the same protocol as the NVLink 310.

In the context of the present description, a single semiconductor platform may refer to a sole unitary semiconductor-based integrated circuit fabricated on a die or chip. It should be noted that the term single semiconductor platform may also refer to multi-chip modules with increased connectivity which simulate on-chip operation and make substantial improvements over utilizing a conventional bus implementation. Of course, the various circuits or devices may also be situated separately or in various combinations of semiconductor platforms per the desires of the user. Alternately, the parallel processing module 525 may be implemented as a circuit board substrate and each of the PPUs 300 and/or memories 304 may be packaged devices.

In an embodiment, the CPU 530, switch 510, and the parallel processing module 525 are situated on a single semiconductor platform.

In an embodiment, the signaling rate of each NVLink 310 is 20 to 25 Gigabits/second and each PPU 300 includes six NVLink 310 interfaces (as shown in FIG. 5B, five NVLink 310 interfaces are included for each PPU 300). Each NVLink 310 provides a data transfer rate of 25 Gigabytes/second in each direction, with six links providing 300 Gigabytes/second. The NVLinks 310 can be used exclusively for PPU-to-PPU communication as shown in FIG. 5B, or some combination of PPU-to-PPU and PPU-to-CPU, when the CPU 530 also includes one or more NVLink 310 interfaces.

In an embodiment, the NVLink 310 allows direct load/store/atomic access from the CPU 530 to each PPU's 300 memory 304. In an embodiment, the NVLink 310 supports coherency operations, allowing data read from the memories 304 to be stored in the cache hierarchy of the CPU 530, reducing cache access latency for the CPU 530. In an embodiment, the NVLink 310 includes support for Address Translation Services (ATS), allowing the PPU 300 to directly access page tables within the CPU 530. One or more of the NVLinks 310 may also be configured to operate in a low-power mode.

Figure 5C:
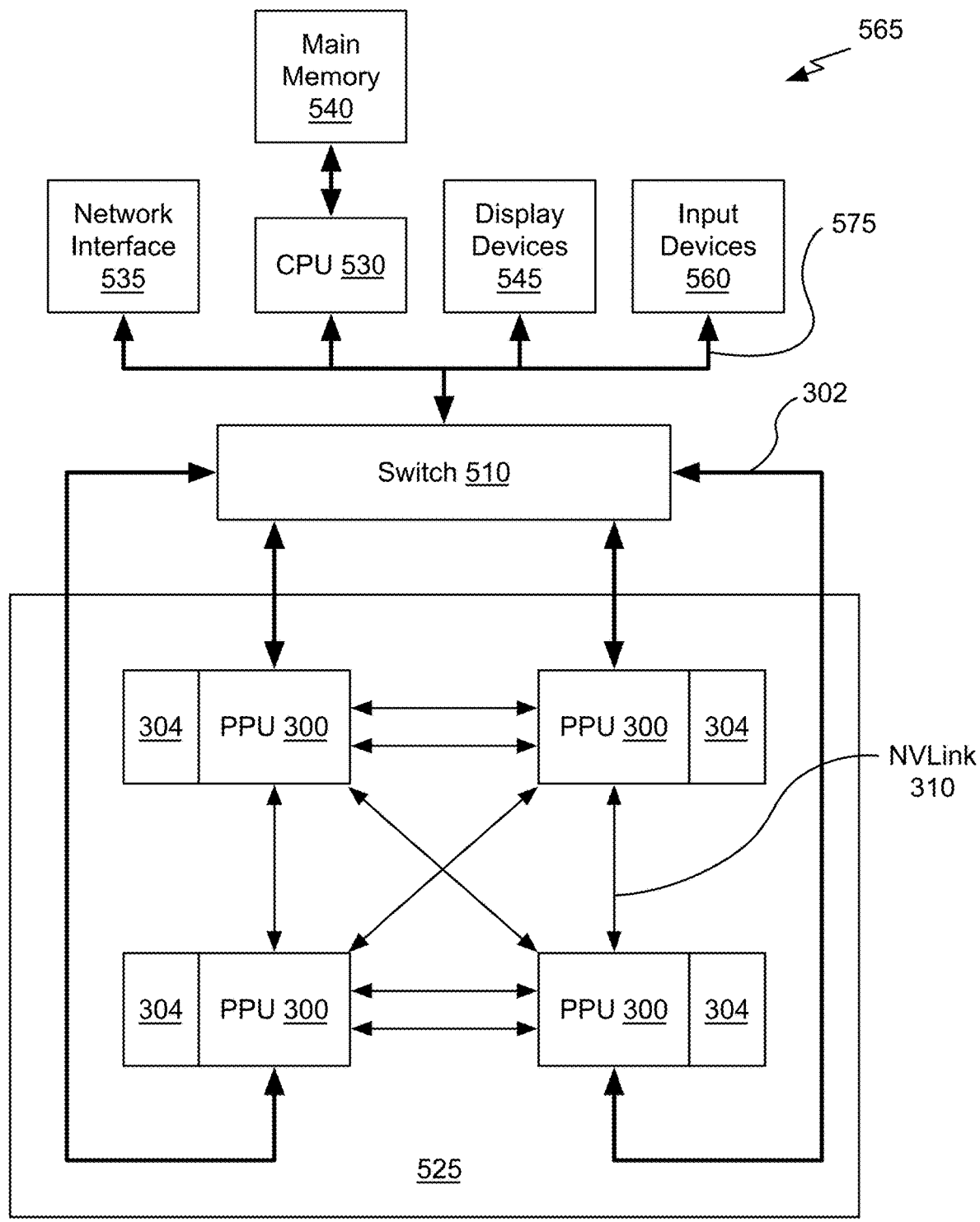
FIG. 5C illustrates an exemplary system in which the various architecture and/or functionality of the various previous embodiments may be implemented.

FIG. 5C illustrates an exemplary system 565 in which the various architecture and/or functionality of the various previous embodiments may be implemented. The exemplary system 565 may be configured to implement the method 140 shown in FIG. 1D and/or the method 160 shown in FIG. 1E.

As shown, a system 565 is provided including at least one central processing unit 530 that is connected to a communication bus 575. The communication bus 575 may be implemented using any suitable protocol, such as PCI (Peripheral Component Interconnect), PCI-Express, AGP (Accelerated Graphics Port), HyperTransport, or any other bus or point-to-point communication protocol(s). The system 565 also includes a main memory 540. Control logic (software) and data are stored in the main memory 540 which may take the form of random access memory (RAM).

The system 565 also includes input devices 560, the parallel processing system 525, and display devices 545, e.g. a conventional CRT (cathode ray tube), LCD (liquid crystal display), LED (light emitting diode), plasma display or the like. User input may be received from the input devices 560, e.g., keyboard, mouse, touchpad, microphone, and the like. Each of the foregoing modules and/or devices may even be situated on a single semiconductor platform to form the system 565. Alternately, the various modules may also be situated separately or in various combinations of semiconductor platforms per the desires of the user.

Further, the system 565 may be coupled to a network (e.g., a telecommunications network, local area network (LAN), wireless network, wide area network (WAN) such as the Internet, peer-to-peer network, cable network, or the like) through a network interface 535 for communication purposes.

The system 565 may also include a secondary storage (not shown). The secondary storage 610 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 540 and/or the secondary storage. Such computer programs, when executed, enable the system 565 to perform various functions. The memory 540, the storage, and/or any other storage are possible examples of computer-readable media.

The architecture and/or functionality of the various previous figures may be implemented in the context of a general computer system, a circuit board system, a game console system dedicated for entertainment purposes, an application-specific system, and/or any other desired system. For example, the system 565 may take the form of a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, a mobile phone device, a television, workstation, game consoles, embedded system, and/or any other type of logic.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Machine Learning

Deep neural networks (DNNs) developed on processors, such as the PPU 300 have been used for diverse use cases, from self-driving cars to faster drug development, from automatic image captioning in online image databases to smart real-time language translation in video chat applications. Deep learning is a technique that models the neural learning process of the human brain, continually learning, continually getting smarter, and delivering more accurate results more quickly over time. A child is initially taught by an adult to correctly identify and classify various shapes, eventually being able to identify shapes without any coaching. Similarly, a deep learning or neural learning system needs to be trained in object recognition and classification for it get smarter and more efficient at identifying basic objects, occluded objects, etc., while also assigning context to objects.

At the simplest level, neurons in the human brain look at various inputs that are received, importance levels are assigned to each of these inputs, and output is passed on to other neurons to act upon. An artificial neuron or perceptron is the most basic model of a neural network. In one example, a perceptron may receive one or more inputs that represent various features of an object that the perceptron is being trained to recognize and classify, and each of these features is assigned a certain weight based on the importance of that feature in defining the shape of an object.

A deep neural network (DNN) model includes multiple layers of many connected nodes (e.g., perceptrons, Boltzmann machines, radial basis functions, convolutional layers, etc.) that can be trained with enormous amounts of input data to quickly solve complex problems with high accuracy. In one example, a first layer of the DNN model breaks down an input image of an automobile into various sections and looks for basic patterns such as lines and angles. The second layer assembles the lines to look for higher level patterns such as wheels, windshields, and mirrors. The next layer identifies the type of vehicle, and the final few layers generate a label for the input image, identifying the model of a specific automobile brand.

Once the DNN is trained, the DNN can be deployed and used to identify and classify objects or patterns in a process known as inference. Examples of inference (the process through which a DNN extracts useful information from a given input) include identifying handwritten numbers on checks deposited into ATM machines, identifying images of friends in photos, delivering movie recommendations to over fifty million users, identifying and classifying different types of automobiles, pedestrians, and road hazards in driverless cars, or translating human speech in real-time.

During training, data flows through the DNN in a forward propagation phase until a prediction is produced that indicates a label corresponding to the input. If the neural network does not correctly label the input, then errors between the correct label and the predicted label are analyzed, and the weights are adjusted for each feature during a backward propagation phase until the DNN correctly labels the input and other inputs in a training dataset. Training complex neural networks requires massive amounts of parallel computing performance, including floating-point multiplications and additions that are supported by the PPU 300. Inferencing is less compute-intensive than training, being a latency-sensitive process where a trained neural network is applied to new inputs it has not seen before to classify images, translate speech, and generally infer new information.

Neural networks rely heavily on matrix math operations, and complex multi-layered networks require tremendous amounts of floating-point performance and bandwidth for both efficiency and speed. With thousands of processing cores, optimized for matrix math operations, and delivering tens to hundreds of TFLOPS of performance, the PPU 300 is a computing platform capable of delivering performance required for deep neural network-based artificial intelligence and machine learning applications.

It is noted that the techniques described herein may be embodied in executable instructions stored in a computer readable medium for use by or in connection with a processor-based instruction execution machine, system, apparatus, or device. It will be appreciated by those skilled in the art that, for some embodiments, various types of computer-readable media can be included for storing data. As used herein, a "computer-readable medium" includes one or more of any suitable media for storing the executable instructions of a computer program such that the instruction execution machine, system, apparatus, or device may read (or fetch) the instructions from the computer-readable medium and execute the instructions for carrying out the described embodiments. Suitable storage formats include one or more of an electronic, magnetic, optical, and electromagnetic format. A non-exhaustive list of conventional exemplary computer-readable medium includes: a portable computer diskette; a random-access memory (RAM); a read-only memory (ROM); an erasable programmable read only memory (EPROM); a flash memory device; and optical storage devices, including a portable compact disc (CD), a portable digital video disc (DVD), and the like.

It should be understood that the arrangement of components illustrated in the attached Figures are for illustrative purposes and that other arrangements are possible. For example, one or more of the elements described herein may be realized, in whole or in part, as an electronic hardware component. Other elements may be implemented in software, hardware, or a combination of software and hardware. Moreover, some or all of these other elements may be combined, some may be omitted altogether, and additional components may be added while still achieving the functionality described herein. Thus, the subject matter described herein may be embodied in many different variations, and all such variations are contemplated to be within the scope of the claims.

To facilitate an understanding of the subject matter described herein, many aspects are described in terms of sequences of actions. It will be recognized by those skilled in the art that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar references in the context of describing the subject matter (particularly in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. Furthermore, the foregoing description is for the purpose of illustration only, and not for the purpose of limitation, as the scope of protection sought is defined by the claims as set forth hereinafter together with any equivalents thereof. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

What is claimed is:

1. A computer-implemented method, comprising:
   initializing a memory device within a system package for testing, wherein the system package includes the memory device and a logic device, a first portion of signals between the memory device and a logic device are routed within an interposer or through silicon vias (TSVs) enclosed by the system package and a second portion of signals for the logic device are coupled to package balls of the system package;
   executing a first test program to test the memory device; and
   concurrent with execution of the first test program, executing a second test program to test a first module within the logic device.

2. The computer-implemented method of claim 1, further comprising, concurrent with execution of the first test program, executing a third test program to test a second module within the logic device.

3. The computer-implemented method of claim 2, wherein the second test program and the third test program are executed concurrently.

4. The computer-implemented method of claim 2, wherein the second test program and the third test program are executed serially.

5. The computer-implemented method of claim 1, wherein the memory device includes a built-in self-test module configured to initialize the memory device for the testing and to execute the first test program.

6. The computer-implemented method of claim 5, wherein the built-in self-test module is coupled to the logic device by the first portion of signals and the logic device initializes the built-in self-test module by transmitting a first signal, in the first portion of signals, to the built-in self-test module.

7. The computer-implemented method of claim 5, wherein the built-in-self-test module is coupled to a set of package balls of the system package and the set of package balls are used to initialize the built-in self-test module.

8. The computer-implemented method of claim 1, further comprising completing execution of the second test program and additional test programs to test additional modules within the logic device before the first test program completes execution.

9. The computer-implemented method of claim 1, further comprising completing execution of the first test program before the second test program completes execution.

10. The computer-implemented method of claim 1, wherein the initializing comprises starting a free-running clock within the memory device.

11. The computer-implemented method of claim 1, further comprising, concurrent with execution of the first test program to test the memory device, executing the first test program to test a second memory device.

12. The computer-implemented method of claim 11, wherein the second memory device is coupled to the logic device through a third portion of signals between the second memory device and that logic device that are separate from the first portion of signals.

13. The computer-implemented method of claim 11, wherein the second memory device is stacked on top of the first memory device.

14. The computer-implemented method of claim 1, wherein first results indicating the absence or presence of faults associated with the memory device are stored in registers when execution of the first test program is complete.

15. The computer-implemented method of claim 1, wherein the memory device is stacked on the logic device.

16. The computer-implemented method of claim 1, wherein the logic device is a graphics processing unit.

17. A system package, comprising:
a memory device within the system package that is configured to be initialized for testing; and
a logic device within the system package that is configured to:
execute a first test program to test the memory device; and
concurrent with execution of the first test program, execute a second test program to test a first module within the logic device, wherein a first portion of signals between the memory device and a logic device are routed within an interposer or through silicon vias (TSVs) enclosed by the system package and a second portion of signals for the logic device are coupled to package balls of the system package.

18. The system package of claim 17, wherein the memory device includes a built-in self-test module that is configured to initialize the memory device for the testing and to execute the first test program.

19. The system package of claim 17, further comprising, a second memory device within the system package, wherein the second memory device is configured to, concurrent with execution of the first test program to test the memory device, execute the first test program to test the second memory device.

20. A non-transitory computer-readable media storing computer instructions for testing that, when executed by one or more processors, cause the one or more processors to perform the steps of:
initializing a memory device within a system package for testing, wherein the system package includes the memory device and a logic device, a first portion of signals between the memory device and a logic device are routed within an interposer or through silicon vias (TSVs) enclosed by the system package and a second portion of signals for the logic device are coupled to package balls of the system package;
executing a first test program to test the memory device; and
concurrent with execution of the first test program, executing a second test program to test a first module within the logic device.

* * * * *